United States Patent
Kim et al.

(10) Patent No.: US 8,125,042 B2
(45) Date of Patent: Feb. 28, 2012

(54) SEMICONDUCTOR PACKAGE AND METHOD OF MANUFACTURING THE SAME

(75) Inventors: Jung-Hwan Kim, Bucheon-si (KR); Un-Byoung Kang, Hwaseong-si (KR); Dong-Hun Yi, Asan-si (KR); Woonseong Kwon, Seoul (KR); Hyung-Sun Jang, Suwon-si (KR); Jongkeun Jeon, Cheonan-si (KR); Yongjin Lee, Cheonan-si (KR); Keeseok Kim, Cheonan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 57 days.

(21) Appl. No.: 12/617,910

(22) Filed: Nov. 13, 2009

(65) Prior Publication Data

US 2010/0117181 A1    May 13, 2010

(30) Foreign Application Priority Data

Nov. 13, 2008 (KR) ................................ 2008-112837
Nov. 6, 2009 (KR) ................................ 2009-107111

(51) Int. Cl.
*H01L 33/00* (2010.01)
*H01L 31/0232* (2006.01)

(52) U.S. Cl. .......... 257/434; 257/99; 257/100; 257/432; 257/E33.058; 257/E33.07; 257/E31.11; 257/E31.127

(58) Field of Classification Search .............. 257/99, 257/100, 432, 434, E33.058, E33.07, E31.11, 257/E31.127

See application file for complete search history.

(56) References Cited

U.S. PATENT DOCUMENTS

| | | | | |
|---|---|---|---|---|
| 6,897,087 | B2 * | 5/2005 | Yanagawa et al. | 438/99 |
| 7,396,741 | B2 * | 7/2008 | Mund et al. | 438/456 |
| 7,648,925 | B2 * | 1/2010 | Moro et al. | 438/780 |
| 7,860,357 | B2 * | 12/2010 | Lee et al. | 385/14 |
| 8,008,739 | B2 * | 8/2011 | Ishii | 257/417 |
| 8,062,974 | B2 * | 11/2011 | Habenicht et al. | 438/666 |
| 2004/0159902 | A1 * | 8/2004 | Li et al. | 257/432 |
| 2006/0030074 | A1 * | 2/2006 | Mund et al. | 438/108 |
| 2006/0038204 | A1 * | 2/2006 | Takasaki et al. | 257/232 |
| 2006/0043544 | A1 * | 3/2006 | Tsukamoto et al. | 257/666 |
| 2008/0296715 | A1 * | 12/2008 | Kumata et al. | 257/432 |
| 2009/0121300 | A1 * | 5/2009 | Voelz | 257/432 |

FOREIGN PATENT DOCUMENTS

| | | |
|---|---|---|
| JP | 2002-124589 | 4/2002 |
| JP | 2005-209854 | 8/2005 |
| JP | 2006-108285 | 4/2006 |
| JP | 2008-053287 | 3/2008 |
| JP | 2008-300698 | 12/2008 |
| KR | 20050060962 | 6/2005 |
| KR | 20080106022 | 12/2008 |

* cited by examiner

Primary Examiner — Victor A Mandala
(74) Attorney, Agent, or Firm — Stanzione & Kim, LLP

(57) ABSTRACT

Provided are a semiconductor package and a method of manufacturing the same. The semiconductor package includes a semiconductor chip, a transparent substrate, an adhesive pattern, and at least one dew-proofer. The semiconductor includes a pixel area. The transparent substrate is disposed on the semiconductor chip. The adhesive pattern is disposed between the semiconductor chip and the transparent substrate and provides a space on the pixel area. At least one dew-proofer is disposed between the semiconductor chip and the transparent substrate and spaced from the adhesive pattern.

21 Claims, 33 Drawing Sheets

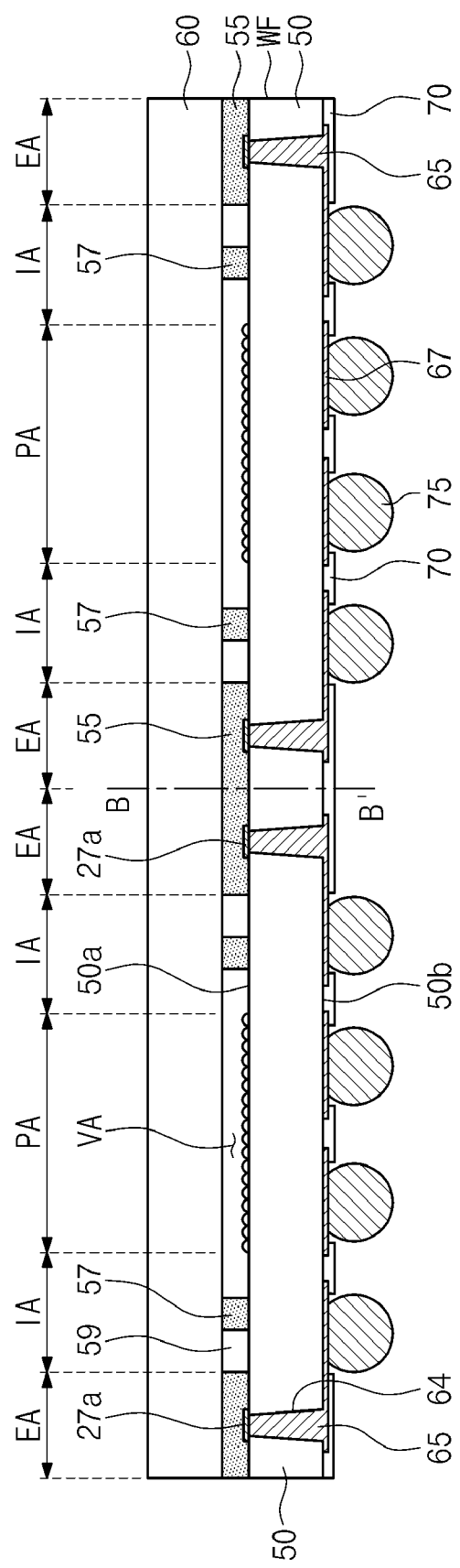

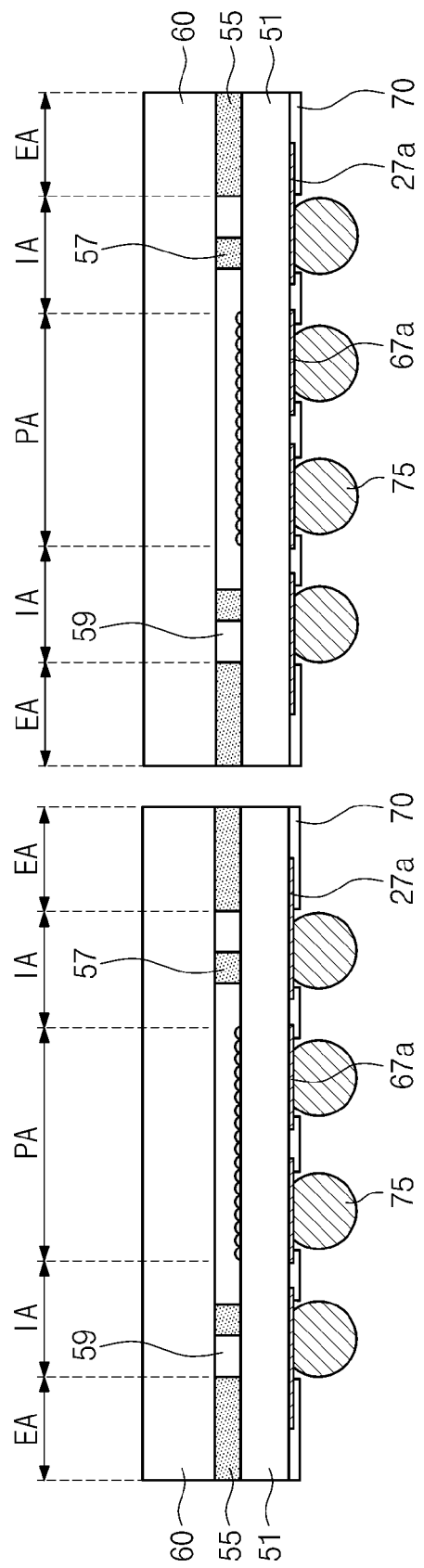

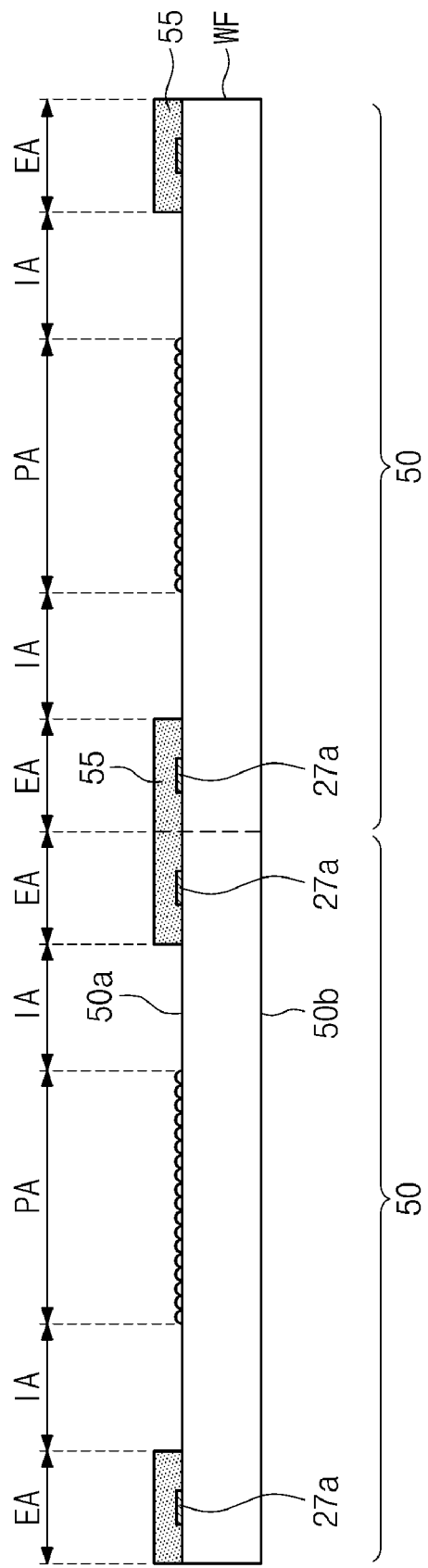

SEMICONDUCTOR PACKAGE AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2008-112837, filed on Nov. 13, 2008, and Korean Patent Application No. 10-2009-0107111, filed on Nov. 6, 2009, the entire contents of which are hereby incorporated by reference.

BACKGROUND

1. Field of the Invention

The present general inventive concept relates to a semiconductor device, and more particularly, to a semiconductor package and a method of manufacturing the same.

2. Description of the Related Art

Image sensors such as CCD sensors and CMOS image sensors are used in various electronic products such as mobile phones, digital cameras, optical mice, surveillance cameras, and biometric devices to receive light corresponding to an object and to convert the received light into an electrical signal to represent an image of the object. The electronic products are required to be minimized and multi-functioning, minimization/high-integration, low power consumption, multi-functioning, ultrafast signal processing, high-reliability, low manufacturing cost, and clear image quality of semiconductor packages including image sensors. Accordingly, various studies are being conducted to meet these requirements.

SUMMARY

The present general inventive concept provides a semiconductor package including an image sensor chip capable of preventing a distortion of an image.

The present general inventive concept also provides a method of manufacturing a semiconductor package including an image sensor chip capable of preventing a distortion of an image.

Additional aspects and utilities of the present general inventive concept will be set forth in part in the description which follows and, in part, will be obvious from the description, or may be learned by practice of the general inventive concept.

Embodiments of the inventive concept provide semiconductor packages including a semiconductor chip including a pixel area, a transparent substrate on the semiconductor chip, an adhesive pattern disposed between the semiconductor chip and the transparent substrate and providing a space on the pixel area, and at least one dew-proofer disposed between the semiconductor chip and the transparent substrate and spaced from the adhesive pattern.

The adhesive pattern may be disposed in an edge area of the semiconductor chip, and the dew-proofer may be disposed between the pixel area and the adhesive pattern.

The dew-proofer may have a lower moisture capacity than that of the adhesive pattern.

The dew-proofer may include the same material as the adhesive pattern, and have a lower width than that of the adhesive pattern.

The adhesive pattern may have a shape of a looped curve arranged along the edge of the semiconductor chip and surrounding the pixel area to seal the space between the semiconductor and the transparent substrate from the outside.

The dew-proofer may have a shape of a looped curve surrounding the pixel area to define a first space on the pixel area between the semiconductor chip and the transparent substrate and a second space between the dew-proofer and the adhesive pattern. The first space may be sealed from the outside by the dew-proofer.

The adhesive pattern may have a ventilating opening formed to connect the second space to the outside.

The semiconductor package may further include a porous adhesive pattern disposed in the ventilating opening and having a better air permeability than the adhesive pattern.

The semiconductor package may further include a connection part that connects the adhesive pattern to the dew-proofer.

The transparent substrate may have a through hole formed to connect the second space to the outside.

The dew-proofer may have a sidewall with a curved surface.

The adhesive pattern may have a side wall facing the dew-proofer and having a curved surface.

In yet further embodiments, the semiconductor chip may include a first surface opposite to the transparent substrate, a second surface on an opposite side of the first surface, a microlens in the pixel area of the first surface, a conductive pad in an edge area of the first surface, and a through via penetrating an inside between the second surface and the first surface and connected to the conductive pad.

The first surface in the pixel area may have a lower height than that of the first surface in the edge area.

In yet further embodiments, the semiconductor chip may include a first surface opposite to the transparent substrate, a second surface on an opposite side of the first surface, a microlens in the pixel area of the first surface, and a conductive pad on the second surface.

The dew-proofer may be formed of a different material from that of the adhesive pattern.

The dew-proofer may block humidity.

In yet further embodiments, the dew-proofer may have a moisture absorption function. In this case, the dew-proofer has a loop, bar, or island shape.

The semiconductor package may further include a solder ball disposed on the second surface. At least one of the adhesive pattern and the dew-proofer may overlap the solder ball.

In other embodiments of the inventive concept, methods for manufacturing a semiconductor package include preparing a semiconductor chip including a pixel area, preparing a transparent substrate, forming an adhesive pattern and a dew-proofer spaced from each other on one of the transparent substrate and the semiconductor chip, and bonding the semiconductor chip and the transparent substrate by disposing the adhesive pattern and the dew-proofer therebetween, wherein the adhesive pattern is formed to surround the dew-proofer.

The adhesive pattern and the dew-proofer may be simultaneously formed of the same material. In this case, the dew-proofer may be formed to have a lower width than that of the adhesive pattern.

The adhesive pattern and the dew-proofer may be formed of a photosensitive adhesive polymer through, for example, a photolithography process.

The adhesive pattern and the dew-proofer may be formed of different materials through different processes from each other. The dew-proofer may be formed through an ink jetting process.

The method may further include forming a ventilating opening by removing a portion of the adhesive pattern.

The foregoing and/or other and aspects and utilities of the present general inventive concept may also be achieved by providing a semiconductor device including a semiconductor substrate, another substrate disposed to form a space with the semiconductor substrate, a photoelectric unit disposed in a pixel area of the space to convert light into a signal, and a plurality of spacers disposed in the space to surround the photoelectric unit.

The plurality spacers may sequentially surround the pixel area of the space.

Each of the plurality of spacers may control a substance generated in the space and an outside of the semiconductor device.

The plurality of spacers may form another space between the plurality of spacers to control transmission of a substance between the space and an outside of the semiconductor device.

The plurality of spacers may form another space between the plurality of spacers, and the another space may have a width wider than a width of one of the plurality of spacers in a direction parallel to one of the semiconductor substrate and another substrate.

The semiconductor device may further include a redistribution unit disposed in the semiconductor substrate to transmit a signal from the photoelectric unit to an outside of the semiconductor substrate, and at least one of the plurality of spacers may be disposed over the redistribution unit.

Each of the plurality of spacers may control a permeability of a substance between the pixel area and an outside of the semiconductor device.

The plurality of spacers may include a first spacer and a second spacer, and the first spacer and the second spacer may have a first permeability of a substance and a second permeability of the substance.

The plurality of spacers may include a first spacer, a second spacer, and another space formed between the first spacer and the second spacer, and the first spacer, the second spacer, and another space may have different characteristics in permeability of a substance The foregoing and/or other and aspects and utilities of the present general inventive concept may also be achieved by providing a semiconductor device including a semiconductor substrate, a photoelectric unit disposed on a surface of the semiconductor substrate to convert light into a signal, a pattern disposed to prevent an external substance from being introduced into an inside space toward the photoelectric unit, and a proofer disposed in the inside space to prevent the external substance of the inside space from being directly introduced toward the photoelectric unit, and a transparent substrate formed on the pattern and the proofer and having a portion corresponding to the photoelectric unit to provide a passage of the light to the photoelectric unit.

The foregoing and/or other and aspects and utilities of the present general inventive concept may also be achieved by providing a semiconductor device including a semiconductor substrate having first and second surfaces, a photoelectric unit disposed on the first surface, a proofer disposed to surround the photoelectric unit, a pattern spaced apart from the proofer by a distance to surround the proofer, a connection unit having a portion disposed on the first surface, and a redistribution unit disposed on the second surface to be connected to the portion of the connection unit to receive a signal from the photoelectric unit.

The foregoing and/or other and aspects and utilities of the present general inventive concept may also be achieved by providing a semiconductor device including a semiconductor substrate, a transparent substrate disposed over the semiconductor substrate, a photoelectric unit disposed on a first surface of the semiconductor substrate in a pixel area between the semiconductor substrate and the transparent substrate to receive light incident through the transparent substrate and to generate a signal according to the received light, a dew proofer and a pattern disposed on the first surface of the semiconductor substrate in a surrounding area between the semiconductor substrate and the transparent substrate to surround the photoelectric unit, a connection unit disposed in the surrounding area of the semiconductor substrate to be connected to the photoelectric unit, and a reconnection unit disposed on a second surface of the semiconductor substrate and connected to the connection unit to transmit the signal to an external device.

The foregoing and/or other and aspects and utilities of the present general inventive concept may also be achieved by providing an electronic apparatus including a semiconductor device having a semiconductor substrate, another substrate disposed to form a space with the semiconductor substrate, a photoelectric unit disposed in a pixel area of the space to convert light into a signal, and a plurality of spacers disposed in the space to surround the photoelectric unit, a signal processor to receive and process the signal to generate another signal representing an image, a display unit to display the image according to the generated another signal, an interface to communicate with an external electronic apparatus, and a controller to control the signal processor and the interface to output the generated another signal to the external electronic apparatus.

The foregoing and/or other and aspects and utilities of the present general inventive concept may also be achieved by providing a method of forming a memory device, the method including forming a semiconductor substrate, forming another substrate disposed to form a space with the semiconductor substrate, forming a photoelectric unit disposed in a pixel area of the space to convert light into a signal, and forming a plurality of spacers disposed in the space to surround the photoelectric unit.

The foregoing and/or other and aspects and utilities of the present general inventive concept may also be achieved by providing a method of forming a semiconductor device, the method including disposing a photoelectric unit on a surface of a semiconductor substrate, disposing a pattern to prevent an external substance from being introduced into an inside space toward the photoelectric unit, and disposing a proofer in the inside space to prevent the external substance of the inside space from being directly introduced toward the photoelectric unit; and forming a transparent substrate on the pattern and the proofer and having a portion corresponding to the photoelectric unit.

The foregoing and/or other and aspects and utilities of the present general inventive concept may also be achieved by providing a method of forming a semiconductor device, the method including forming a photoelectric unit on a first surface of a semiconductor substrate, forming a proofer to surround the photoelectric unit, forming a pattern to be spaced apart from the proofer by a distance to surround the proofer, forming a connection unit having a portion on the first surface, and forming a redistribution unit on a second surface of the semiconductor substrate to be connected to the portion of the connection unit to receive a signal from the photoelectric unit.

BRIEF DESCRIPTION OF THE DRAWINGS

The above and/or other aspects of the present general inventive concept will become apparent and more readily appreciated from the following description of the exemplary embodiments, taken in conjunction with the accompanying drawings, in which:

FIG. 4A through 4D are cross-sectional views sequentially illustrating a process of forming the semiconductor package of FIG. 2;

FIG. 8A through 8D are cross-sectional views sequentially illustrating a process of forming the semiconductor package of FIG. 6;

FIG. 21A through 21D are cross-sectional views sequentially illustrating a process of forming the semiconductor package of FIG. 20;

DETAILED DESCRIPTION OF THE EMBODIMENTS

Figure 1:
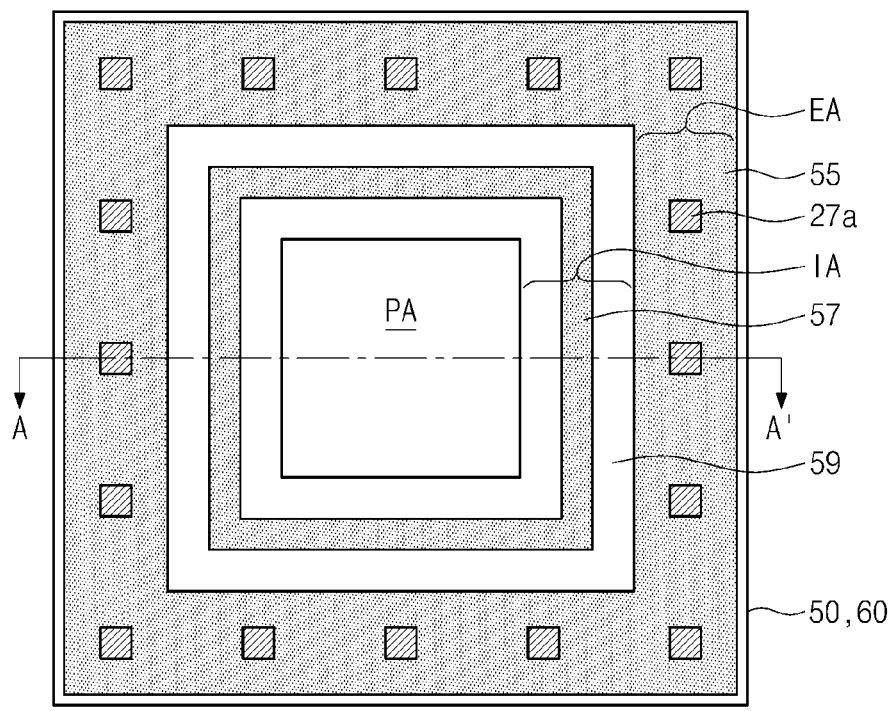
FIG. 1 is a plan view illustrating a semiconductor package according to an embodiment of the present general inventive concept.

Hereinafter, Exemplary embodiments of a semiconductor package and a method for manufacturing the same will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
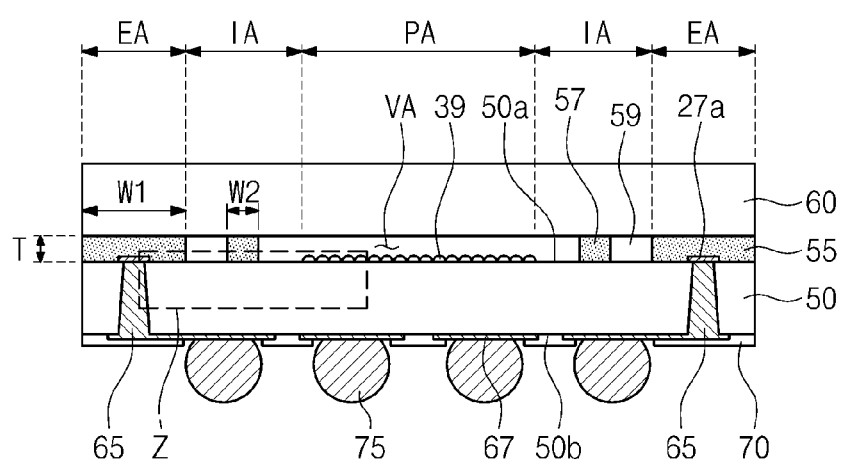
FIG. 2 is a cross-sectional view taken along line A-A' of FIG. 1.
Figure 3:
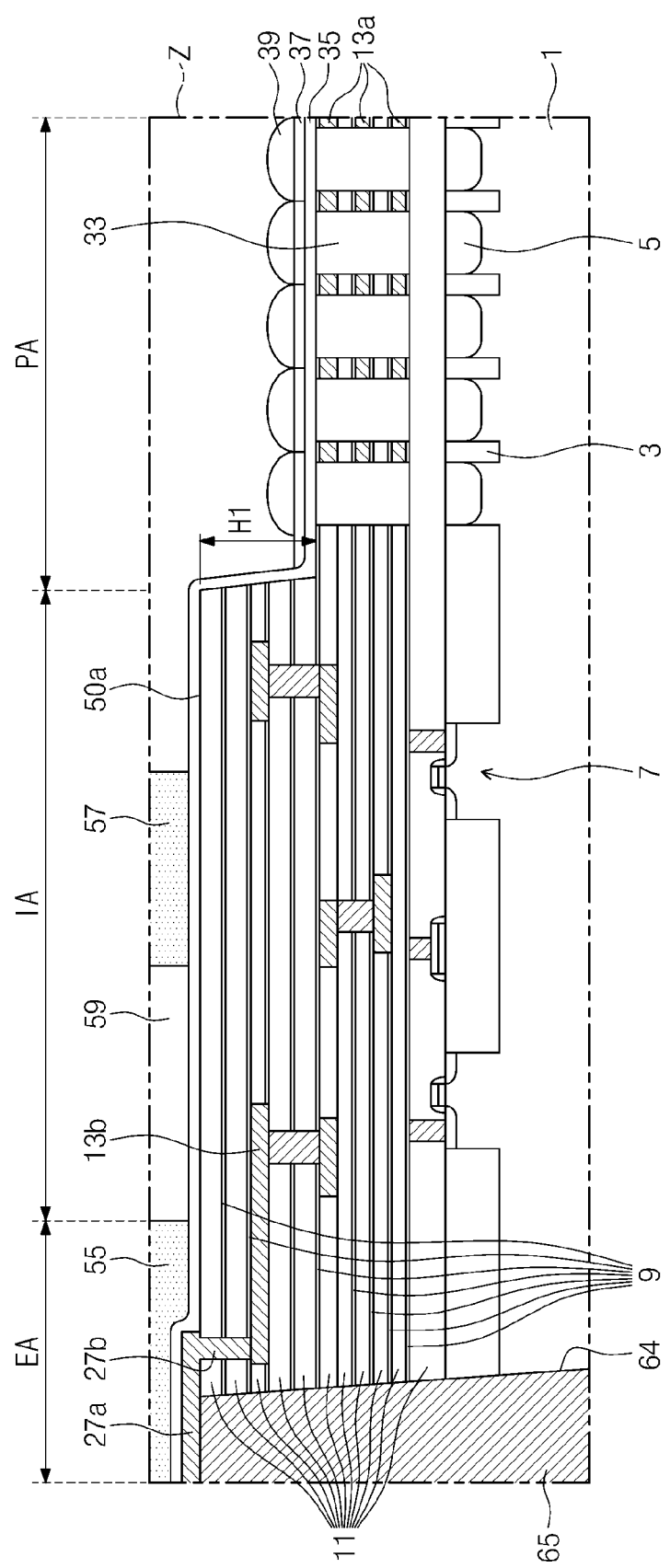
FIG. 3 is an enlarged view illustrating 'Z' of FIG. 2.

FIG. 1 is a plan view illustrating a semiconductor package 100 according to an embodiment of the present general inventive concept. FIG. 2 is a cross-sectional view taken along line A-A' of FIG. 1, and FIG. 3 is an enlarged view illustrating 'Z' of FIG. 2.

Referring to FIGS. 1 and 2, the semiconductor package 100 includes a semiconductor chip 50 and a transparent substrate 60. The semiconductor chip 50 includes a pixel area (or pixel area) PA, an edge area EA, and an interface area IA disposed between the pixel area PA and the edge area EA. The semiconductor chip 50 includes a first surface 50a and a second surface 50b. The first surface 50a faces the transparent substrate 60, and the second surface 50b is on the opposite side of the first surface 50a. A micro lens unit, for example, an array of microlenses 39, is disposed on the first surface 50a in the pixel area PA. Although illustrated to have a regular square shape in FIG. 1, the pixel area PA may have a rectangular shape. An adhesive pattern 55 is interposed between the semiconductor chip 50 and the transparent substrate 60 to bond the semiconductor chip 50 and the transparent substrate 60. For example, the adhesive pattern 55 may include photosensitive adhesive polymers, thermosetting polymers, and/or epoxy-based mixtures. As an example, the adhesive pattern 55 may include a benzocyclobutene. In this embodiment, the adhesive pattern 55 is arranged along the edge area EA of the semiconductor chip 50 to have a shape of a ring (or a looped curve) surrounding the pixel area PA. In this embodiment, the adhesive pattern 55 seals a first void area VA, a space between the transparent substrate 60 and the semiconductor chip 50 in the pixel area PA from an outside thereof. Thus, the adhesive pattern 55 may protect the first void area VA from an external environment. The adhesive pattern 55 may have an adhesive strength, a thickness T, and a width (a first width W1) enough to reliably bond the transparent 60 and the semiconductor chip 50. The width W1 of the adhesive pattern 55 may be greater than about 250 μm.

Referring again to FIGS. 1 and 2, a dew-proofer 57 is disposed between the edge area EA and the pixel area PA. It is possible that the dew-proofer 57 may be disposed between the adhesive pattern 55 disposed in the edge area EA and the microlenses 39 disposed in the pixel area PA. That is, the dew-proofer 57 is disposed in the interface area IA between the semiconductor chip 50 and the transparent substrate 60. The dew-proofer 57 may be spaced from the adhesive pattern 55. In this embodiment, the dew-proofer 57 may be formed of the same material as the adhesive pattern 55. Here, a width (a second width W2) of the dew-proofer 57 may be less than the width W1 of the adhesive pattern 55. The width of the dew-proofer 57 may be less than 100 μm. The dew-proofer 57 may have a ring shape surrounding the pixel area PA. The dew-proofer 57 seals and protects the first void area VA of the pixel area PA from the outside. The dew-proofer 57 may be spaced from the adhesive pattern 55 to form a second void area 59.

The dew-proofer 57 may have the same thickness T as the adhesive pattern 55. However, the present general inventive concept is not limited thereto. It is possible that the thicknesses of the adhesive pattern 55 and dew-proofer 57 may be different before the adhesive pattern 55 and dew-proofer 57 are disposed between the semiconductor chip 50 and the transparent substrate 60. However, the different thicknesses of the adhesive pattern 55 and dew-proofer 57 may become same, for example, the same thickness T, when the semiconductor chip 50 and the transparent substrate 60 are bonded to each other through at least one of the adhesive pattern 55 and the dew-proofer 57.

The adhesive pattern 55 and the dew proofer 57 may be referred to as spacers to provide another space between them to accommodate dew or moisture corresponding to a particle or to control generation or transmission of dew or moisture (humidity) corresponding to a particle which can affect a performance of a semiconductor device of the semiconductor package 100.

The adhesive pattern 55 surrounds a peripheral side of the micro lens unit, and the dew proofer 57 is surrounded by the adhesive pattern 55 and surrounds at least a portion of the peripheral side of the micro lens unit as illustrated in FIGS. 1 and 2. The adhesive pattern 55 and the dew proofer 57 surround a circumferential external side of the pixel area. The circumferential external side of the pixel area may be an entire circumferential external side. If the pixel area or the micro lens unit has a rectangular shape, at least one of the adhesive pattern 55 and the dew proofer 57 has a shape same as or similar to the rectangular shape. However, the present general inventive concept is not limited thereto. The pixel area, the adhesive pattern 55, and the dew proofer 57 may have at least one of different shapes.

The adhesive pattern 55 may be required to have excellent adhesive property for reliability of the semiconductor package 100. However, when adhesive polymers are used as the adhesive pattern 55, the adhesive polymers of the adhesive pattern 55 may not completely block humidity. Accordingly, when the semiconductor package 100 is exposed to an environment, for example, a high temperature and/or humidity environment, it is possible that the humidity gradually permeates the void areas VA and 59 through the adhesive pattern 55 and the dew-proofer 57. Also, it is possible that the humidity also exists in the adhesive pattern 55 and the dew-proofer 57. The permeation is gradually progressed until the humidity of the void areas VA and 59 becomes identical to the humidity of the outside, that is, the state of equilibrium.

If the semiconductor package 100 that has been exposed to a high temperature and/or humidity environment is exposed to another environment, for example, a low temperature and/or humidity environment, moistures of high humidity in the void areas VA and 59 may escape to the outside through the dew-proofer 57 and the adhesive pattern 55 to reach the state of equilibrium with the outside of low humidity. Moistures that are in the state of equilibrium under a high temperature and humidity environment of the dew-proofer 57 and the adhesive pattern 55 escape to the outside to reach the state of equilibrium with the outside of low humidity. In this case, the moistures that exist in the dew-proofer 57 and the adhesive pattern 55 also escape to the void areas VA and 59. Since the width W1 of the adhesive pattern 55 is greater than the width W2 of the dew-proofer 57, the amount of the adhesive pattern 55 is much larger than the amount of the dew-proofer 57. Since the amount of the adhesive pattern 55 is larger, the amount of moisture permeable into the adhesive pattern 55 is also larger than that of the dew-proofer 57. Accordingly, most moisture contained in the adhesive pattern 55 escapes to the outside and a second void area 59 adjacent thereto. If the dew-proofer 57 is not provided, most of the moisture contained in the adhesive pattern 55 may directly enter the first void area VA to form dew on the undersurface of the substrate 60.

However, since the dew-proofer 57 is located between the pixel region PA and the adhesive pattern 55 to block humidity contained in the adhesive pattern 55, dew (condensation and/or water or vapor particles) may not be formed on the undersurface of the transparent substrate 60. The dew-proofer 57 may contain humidity therein. However, since the width of the dew-proofer 57 is relatively small, the amount of humidity contained in the dew-proofer 57 is also relatively small. Accordingly, although the humidity contained in the dew-proofer 57 is exhausted (discharged) to the first void area VA and the second void area 59 adjacent thereto, dew may not be formed on the undersurface of the transparent substrate 60 because the amount of humidity is small. Thus, the semiconductor package 100 according to this embodiment may prevent dew from being formed on the undersurface of the transparent substrate 60 by including the dew-proofer 57.

Referring to again FIGS. 1 through 3, the semiconductor chip 50 according to this embodiment may be a front side-illuminated image sensor chip. In the semiconductor chip 50, a conductive pad 27a is disposed in an edge area EA of the first surface 50a on which the micro lenses 39 are disposed. At the inside of the semiconductor chip 50, device isolation layers 3 are disposed over the semiconductor substrate 1 to define active regions. A plurality of photoelectric conversion units 5 is disposed in the pixel area PA of the semiconductor substrate 1. A plurality of transistors 7 is disposed over the semiconductor substrate 1 to deliver and process signals transmitted from the photoelectric conversion units 5. In areas except the pixel area PA, that is, the edge area EA and the interface area IA, the transistors 7 constitute a peripheral circuit (or an internal circuit) to control a signal transmission between the photoelectric conversion units 5 and the conductive pads 27a. The transistors 7 and the photoelectric conversion unit 5 are covered with multi-layered interlayer dielectrics (or dielectric layers) 11 and etch stop layers 9 that are alternately stacked. Interconnections 13a and 13b are disposed between the interlayer dielectrics 11 and the etch stop layers 9 to connect the photoelectric conversion units 5 and the conductive pads 27a through the peripheral circuits of the transistors 7 to provide the signal transmission. The interconnections 13a and 13b may be divided into a first interconnection 13a located at the pixel area PA and a second interconnection 13b located at the peripheral circuit areas EA and IA. As an example, the interlayer dielectrics 11 and the etch stop layers 9 located at the upper part of the pixel area PA may be partially removed. Thus, there may be a height difference of H1 between the uppermost interlayer dielectric 11 in the edge area EA and the interface area IA and the uppermost etch stop layer 9 in the pixel area PA. That is, the first surface 50a is recessed in the pixel area PA as a recessed first surface 50. The height difference may be provided to enhance photosensitivity and implement clear image quality by reducing an optical path of light incident to the photoelectric conversion unit 5 and an optical loss.

Furthermore, the interlayer dielectrics 11 and the etch stop layers 9 in a position overlapping the photoelectric conversion unit 5 in the pixel area PA may be removed, and a resin pattern having excellent transmittance may be disposed. The photosensitivity and implement clear image quality may be enhanced by preventing reflection and/or diffraction and/or interference of light caused by the interlayer dielectric 11 and the etch stop layers 9 during incidence of the light and reducing an optical loss. The first interconnections 13a disposed in the pixel area PA are disposed in positions overlapping the device isolation layer 3 so as to prevent interception/reflection of light incident to the photoelectric conversion unit 5. A conductive pad 27a is disposed on the upper surface of the uppermost interlayer dielectric 11 in the edge area EA. The conductive pad 27a may be integrally formed with a via plug 27b connected to the second interconnection 13b. The upper surfaces of the conductive 27a, the uppermost interlayer dielectric 11, and the resin pattern 33 may be covered with a planarization layer 35. Color filters 37 are disposed over the planarization layer 35 in the pixel area PA to overlap the photoelectric conversion unit 5 corresponding to each pixel. The color filters 37 may be a RGB (red, green, and blue) type color that divides natural light into three primary colors, and a complementary color type color filter that divides natural light into four colors of CYGM (cyan, yellow, green, and magenta). Microlenses 39 are disposed over the color filter 37.

In the front side image sensor chip as described above, the conductive pad 27a is disposed over the first surface 50a on which the microlenses 39 are disposed. Accordingly, the semiconductor chip 50 having such a structure may include a through via (or conductive line) 65 formed in a via hole 64 to reduce the total size of the package and increase the signal transmission speed. That is, the through via 65 may be disposed to cover a sidewall of a via hole 64 to exposed the lower surface of the conductive pad 27a through the semiconductor chip 50. The through via 65 may be formed by filling the through via hole 64. The through via 65 is connected to a re-interconnection pad 67 disposed on the second surface 50b through a conductive pattern formed on or in the second surface 50b of the semiconductor chip 50. The through via 65 and the re-interconnection pad 67 may be partially covered with an insulating film 70. An external connection terminal such as a solder ball 75 may be attached to a portion of the re-interconnection pad 67 that is exposed without being covered with the insulating film 70. In this case, the solder ball 75 may be disposed to overlap at least one of the adhesive pattern 55 and the dew-proofer 57. Here, since the adhesive pattern 55 and the dew-proofer 57 have elasticity, the adhesive pattern 55 and the dew-proofer 57 may serve to reduce physical stress delivered through the solder ball 75 when the semiconductor package 100 is mounted onto a mother board or the like.

Hereinafter, a process of forming the semiconductor package 100 will be described with reference to FIG. 4A through 4D which are cross-sectional views sequentially illustrating operations of forming the semiconductor package 100 of FIG. 2.

Figure 4A:
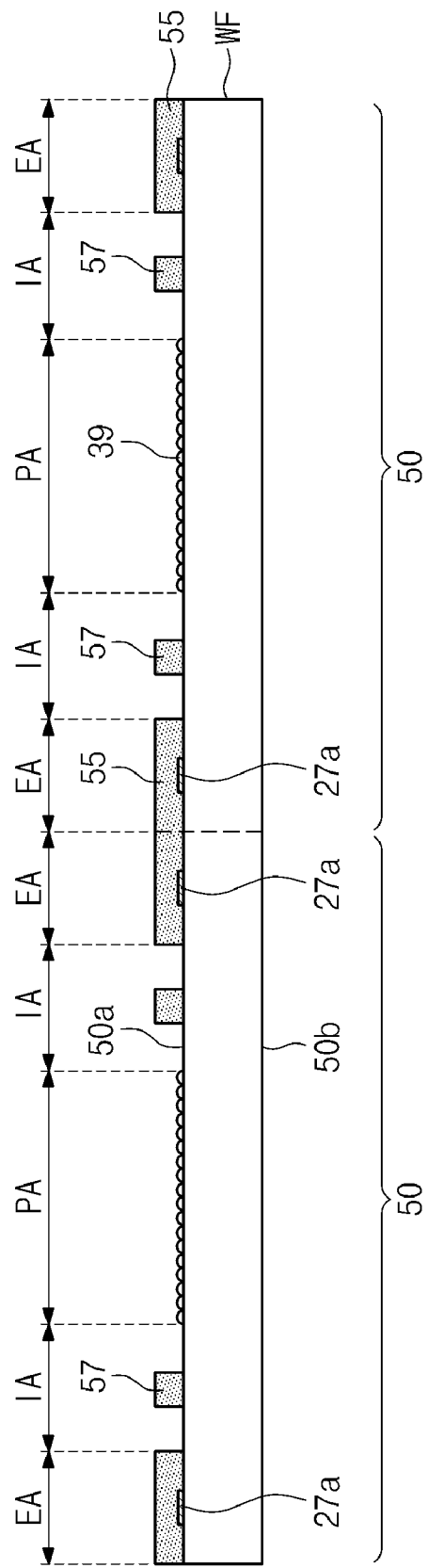

Referring to FIG. 4A, a wafer WF is prepared which includes unit semiconductor chips 50 including other parts of FIGS. 2 and 3 except the through via hole 64, the through via 65, the re-interconnection pad 67, and the insulating film 70. An adhesive pattern 55 and a dew-proofer 57 are formed over the wafer WF. The adhesive pattern 55 is formed on the first surface 50a in an edge area EA and may cover the conductive pad 27a which is formed on or in the first surface 50a, and the dew-proofer 57 is formed in an interface area IA to be spaced from the adhesive pattern 55. The adhesive pattern 55 and the dew-proofer 57 may be simultaneously formed of the same material. As a specific example, a photosensitive adhesive polymer film is coated on the front surface of the wafer WF and is processed through a soft baking process at a low temperature of about 50° C. to about 70° C., to form the adhesive pattern 55 and the dew-proofer 57. Then, an exposure process and a development process are performed to form the adhesive pattern 55 and the dew-proofer 57. Besides, the adhesive pattern 55 and the dew-proofer 57 may be formed through a screen printing or ink jetting method.

Figure 4B:
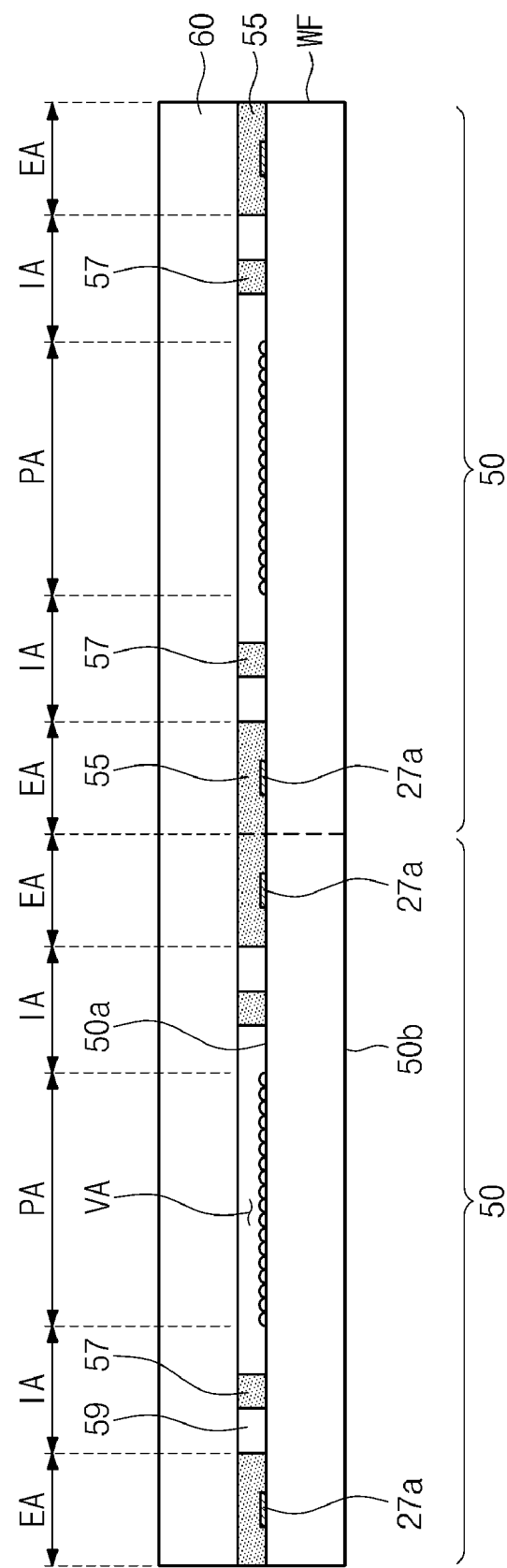

Referring to FIG. 4B, a transparent substrate 60 is disposed over the wafer WF on which the adhesive pattern 55 and the dew-proofer 57 are formed. Then, the transparent substrate 60 is bonded to the wafer WF by pressing and heating. For example, the bonding process may be performed at a temperature ranging from about 150 to about 210. Thus, a first void area VA and a second void area 59 may be defined between the transparent substrate 60 and the wafer WF.

Referring to FIG. 4C, the wafer WF in the edge area EA is partially removed by a laser or the like, forming a through via hole 64 exposing the lower surface of a conductive pad 27a. Then, by stacking and patterning a conductive layer, a through via 65 covering the sidewall of the through via hole 64 and contacting the conductive pad 27a, and a re-interconnection pad 67 disposed on a second surface 50b and electrically connected to the through via 65 are formed. An insulating film 70 is formed to cover a portion of the re-interconnection pad 67 and the through via 65. A solder ball 75 is attached to the re-interconnection pad 67 exposed without being covered with the insulating film 70.

Figure 4D:
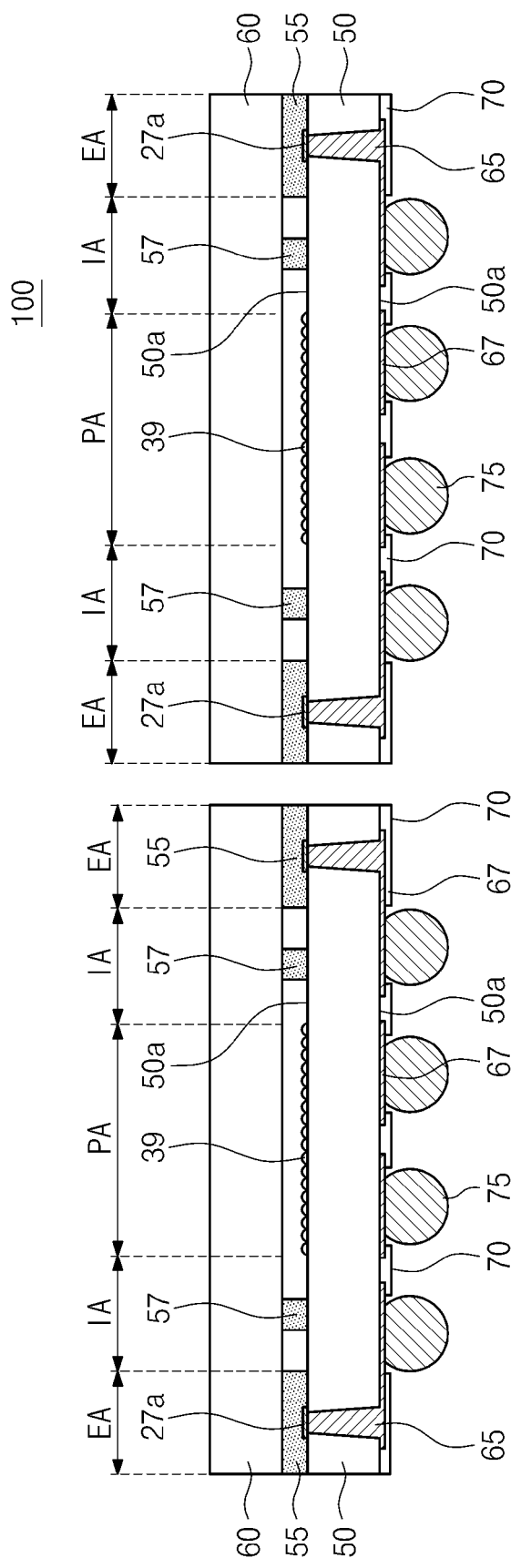

Referring to FIGS. 4C and 4D, a singulation process is performed to cut the transparent substrate 60 and the wafer WF along line B-B' into unit semiconductor chips 50 and separate them into unit semiconductor chips 50. The singulation process may be performed using a diamond cutting blade and the like. Thus, the semiconductor package 100 described in FIGS. 1 and 2 may be formed.

In this embodiment, although it has been described that the adhesive pattern 55 and the dew-proofer 57 are formed on the surface of the wafer WF, the adhesive pattern 55 and the dew-proofer 57 may be formed on the transparent substrate 60. Thereafter, the wafer WF may be bonded to the transparent substrate 60 and be reversed.

Figure 5:
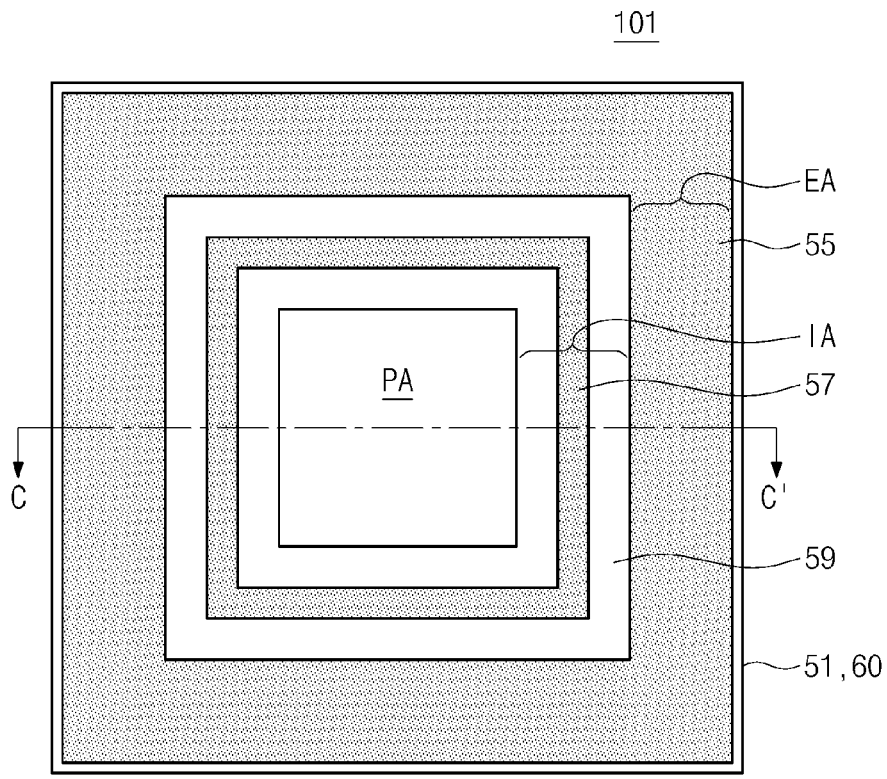
FIG. 5 is a plan view illustrating a semiconductor package according to an embodiment of the present general inventive concept.
Figure 6:
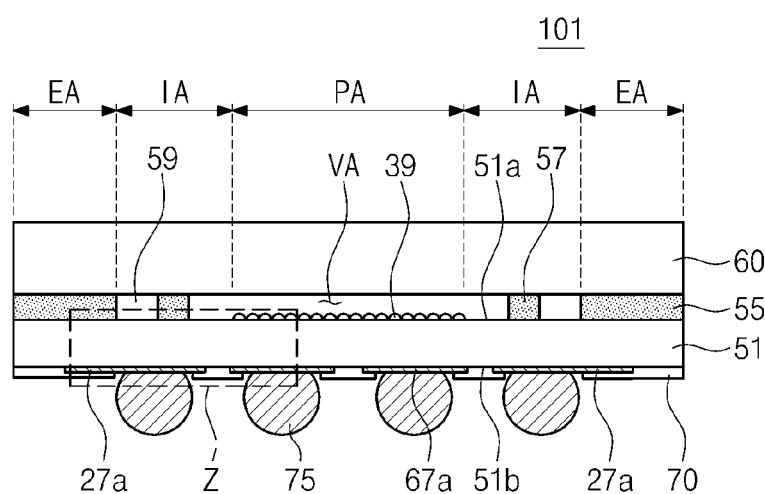
FIG. 6 is a cross-sectional view taken along line C-C' of FIG. 5.
Figure 7:
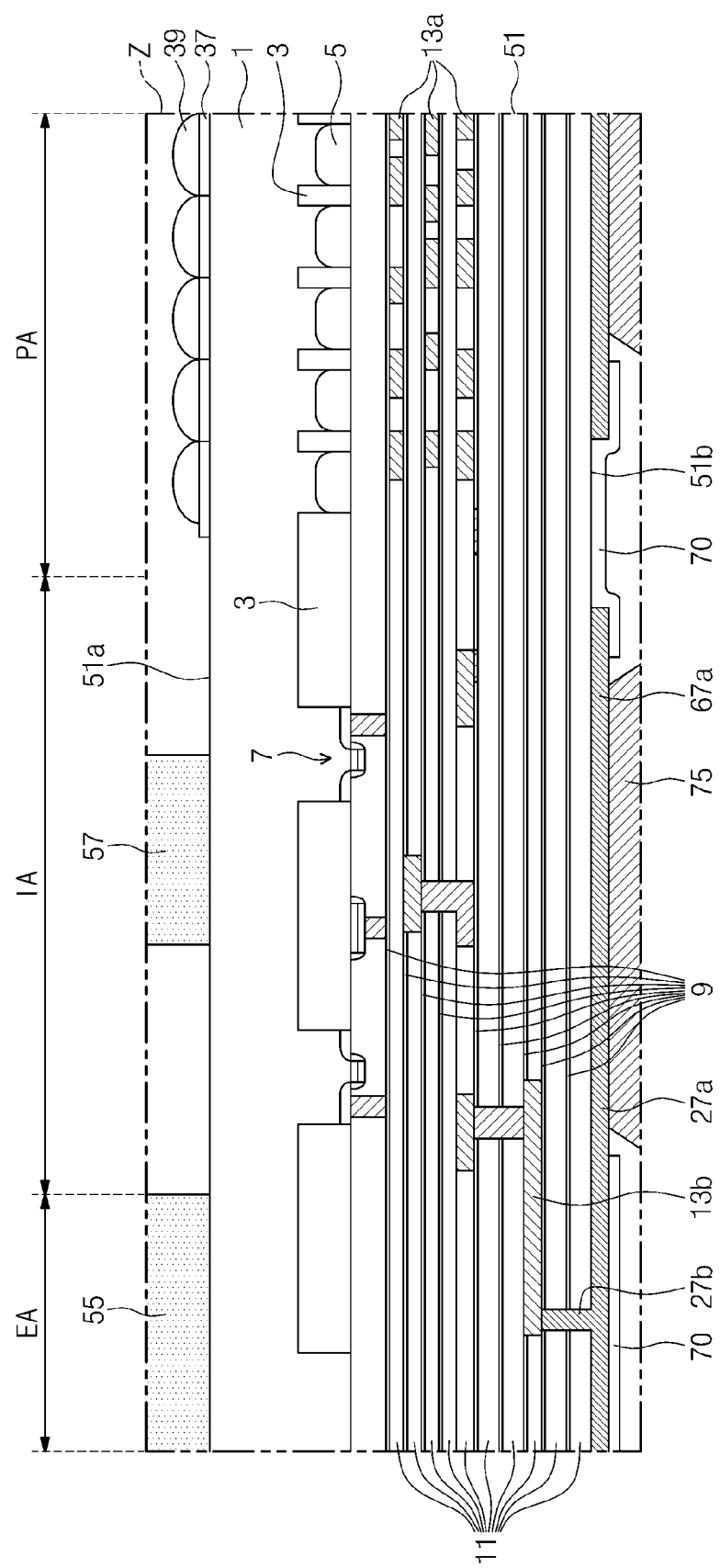
FIG. 7 is an enlarged view illustrating 'Z' of FIG. 6.

FIG. 5 is a plan view illustrating a semiconductor package 101 according to an embodiment of the present general inventive concept. FIG. 6 is a cross-sectional view taken along line C-C' of FIG. 5, and FIG. 7 is an enlarged view illustrating 'Z' of FIG. 6. Since the embodiment of FIGS. 5-7 is similar to the embodiment of FIGS. 1-4D, detail descriptions are omitted. That is, different features of the embodiment of FIGS. 5-7 from the embodiment of FIGS. 1-4D will be described.

Referring to FIGS. 5 through 7, a semiconductor chip 51 included in the semiconductor package 101 according to this embodiment is a backside-illuminated image sensor chip. The semiconductor chip 51 includes a first surface 51a opposite to a transparent substrate 60 and a second surface 51b on the opposite side of the first surface 51a. Microlenses 39 are disposed in a pixel area PA of the first surface 51a. However, a conductive pad 27a is disposed in an edge area EA of the second surface 51b instead of the first surface 51a. The semiconductor chip 51 has a structure having a portion similar to a reversed portion of the semiconductor chip 50 of FIG. 1. Light incident through the microlens 39 and the color filter 37 may be directly incident to a photoelectric conversion unit 5. In this case, a portion of the semiconductor substrate 1 may be removed to reduce an optical path. Since the light is directly incident to the photoelectric conversion unit 5 through the semiconductor substrate 1, there is no limitation by a location of a first interconnection 13a. Also, it is not necessary to form a recessed shape by removing the multi-layered interlayer dielectrics 11 and the etch stop layers 9 from the pixel area PA. Furthermore, the resin pattern of embodiment 1 is unnecessary. Since the conductive pad 27a is disposed on the second surface 51b, the through via 65 of embodiment 1 is unnecessary. In addition, since a ball land 67a corresponding to the re-interconnection 67 of embodiment 1 may be formed by extending the conductive pad 27a when the conductive pad 27a is formed, the process may be simplified.

Hereinafter, a process of forming the semiconductor package 101 will be described. FIG. 8A through 8D are cross-sectional views sequentially illustrating a process of forming the semiconductor package of FIG. 6.

Referring to 8A, a wafer WF is prepared which includes unit semiconductor chips 51 including other parts except a solder ball 75. A protection film 71 is formed the back side of the wafer WF and/or an insulation film 70 which correspond to the second surface 51b. For example, the protection film 71 may be formed by attaching a backlap tape to the back side of the wafer WF and/or an insulation film 70. The protection film 71 prevents the second surface 51b from being damaged or contaminated during processing. An adhesive pattern 55 and a dew-proofer 57 are formed on the first surface 51a of the wafer WF. The adhesive pattern 55 is formed in an edge area EA, and the dew-proofer 57 is formed in an interface area IA to be spaced from the adhesive pattern 55. The adhesive pattern 55 and the dew-proofer 57 may be simultaneously formed of the same material. As an example, a photosensitive adhesive polymer film is coated on the front surface of the wafer WF, and then processed through a soft baking process at a low temperature of about 50° C. to about 70° C., to form the adhesive pattern 55 and the dew-proofer 57. Then, an exposure process and a development process are performed to form the adhesive pattern 55 and the dew-proofer 57. Besides, the adhesive pattern 55 and the dew-proofer 57 may be formed through a screen printing or ink jetting method.

Figure 8A:
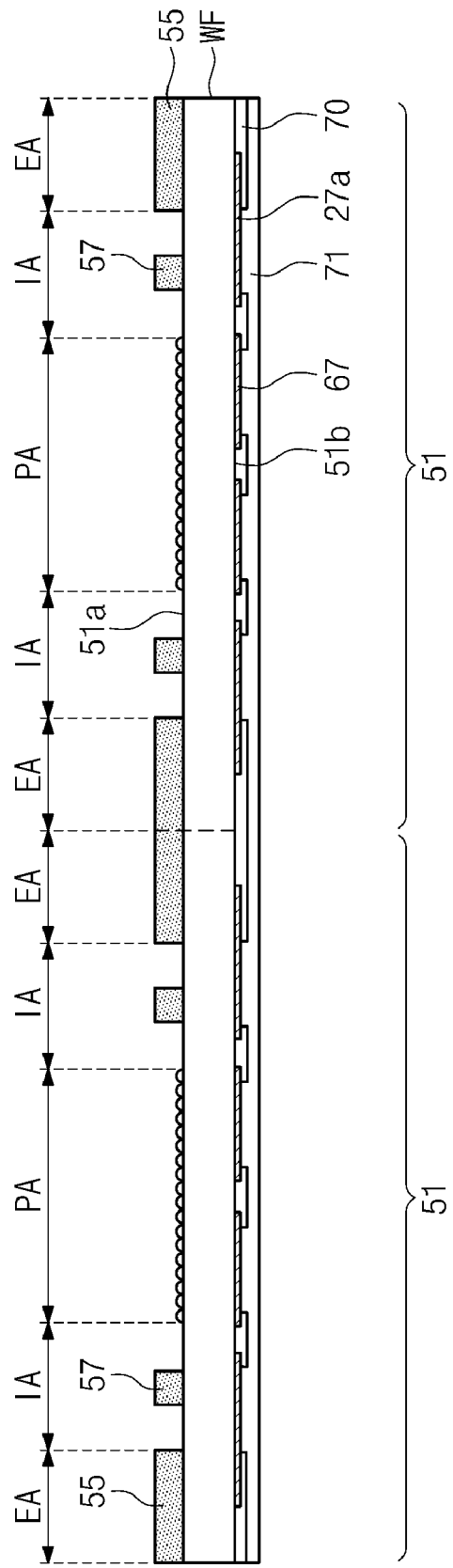
Figure 8B:
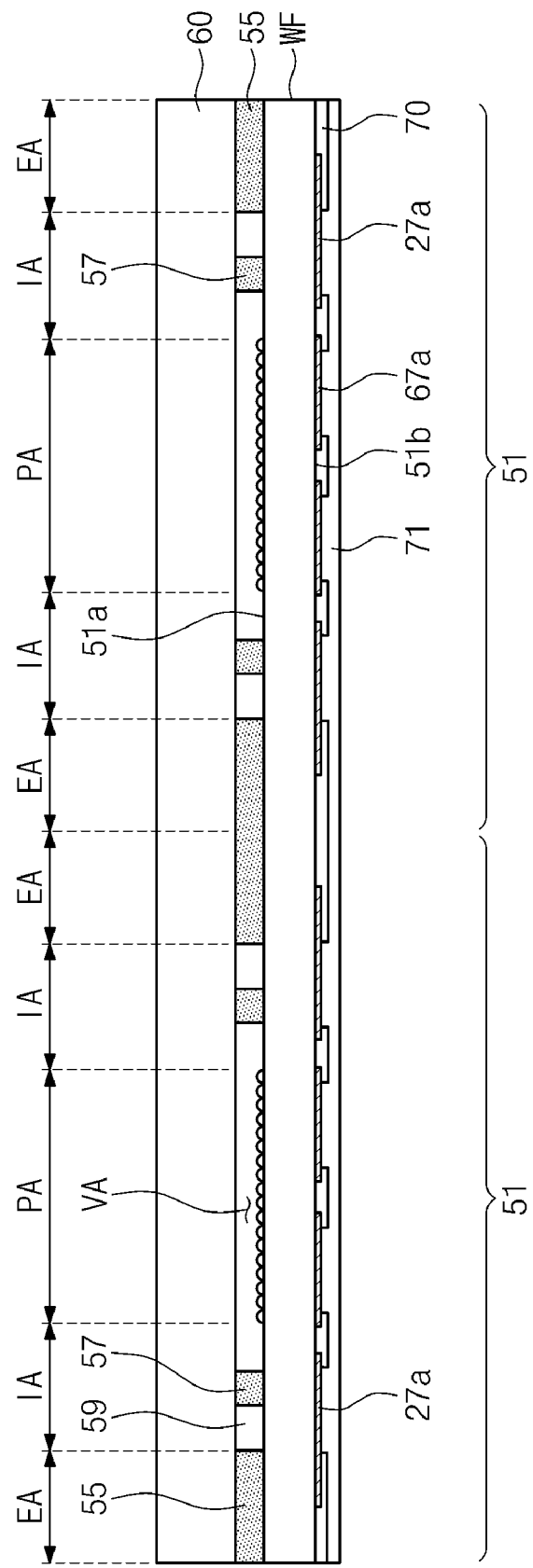

Referring to FIG. 8B, a transparent substrate 60 is disposed over the wafer WF on which the adhesive pattern 55 and the dew-proofer 57 are formed. Then, the transparent substrate 60 is bonded to the wafer WF by pressing and heating. For example, the bonding process may be performed at a temperature ranging from about 150 to about 210. Thus, a first void area VA and a second void area 59 may be defined between the transparent substrate 60 and the wafer WF.

Figure 8C:
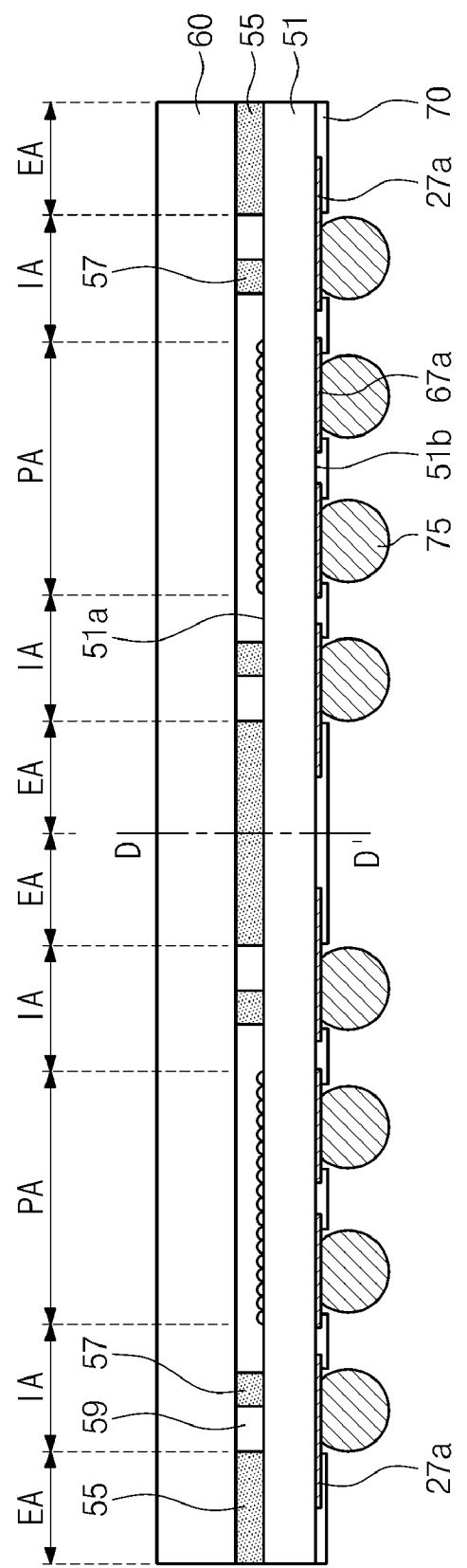

Referring to FIG. 8C, the protection film 71 is removed from the second surface 51b to expose the insulating film 70 and the ball land 67a. Then, a solder ball 75 is attached to the ball land 67a.

Referring to FIGS. 8C and 8D, a singulation process is performed to cut the transparent substrate 60 and the wafer WF along line D-D' into unit semiconductor chips 50 and separate them into unit semiconductor chips 50. The singulation process may be performed using a diamond cutting blade and the like. Thus, the semiconductor package 101 described in FIGS. 5 and 6 may be formed.

Figure 9A:
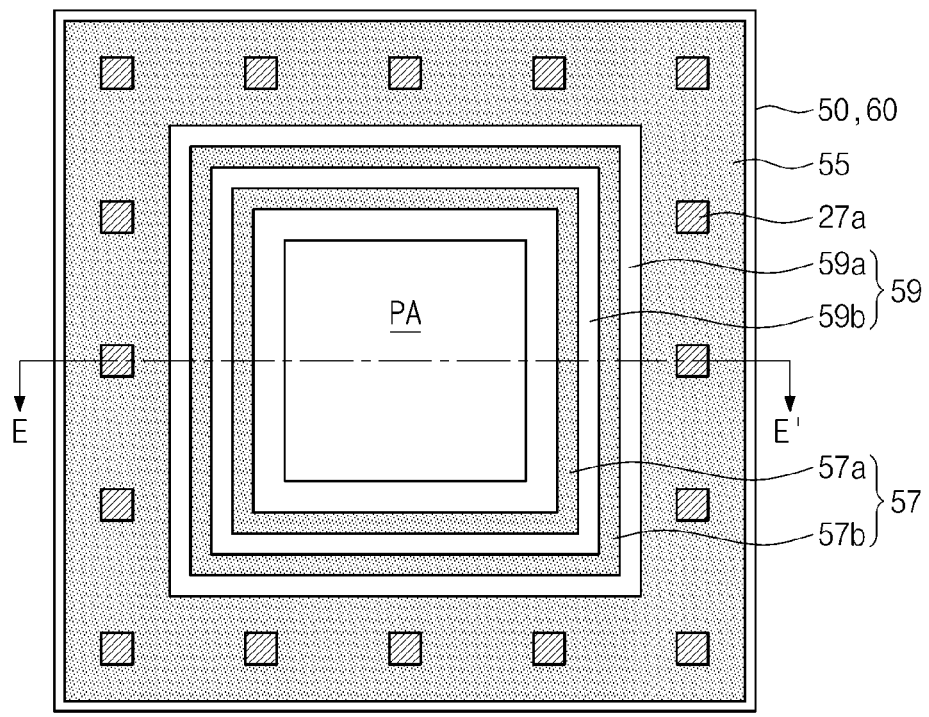
FIG. 9A is a plan view illustrating a semiconductor package according to an embodiment of the present general inventive concept.
Figure 9B:
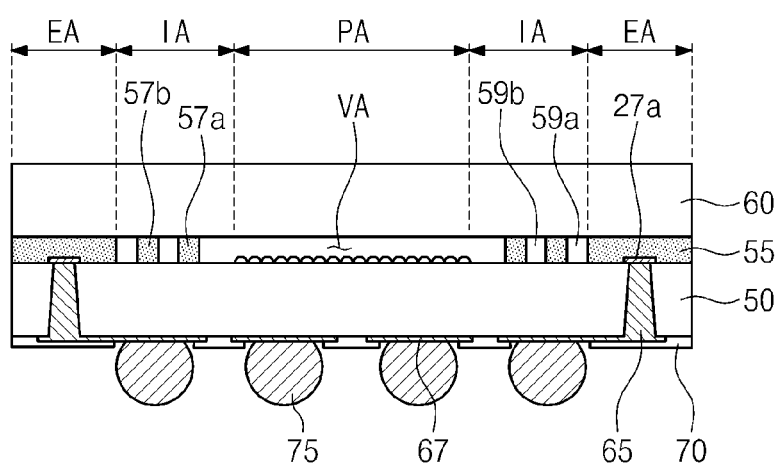
FIG. 9B is a cross-sectional view take along line E-E' of FIG. 9A
Figure 10A:
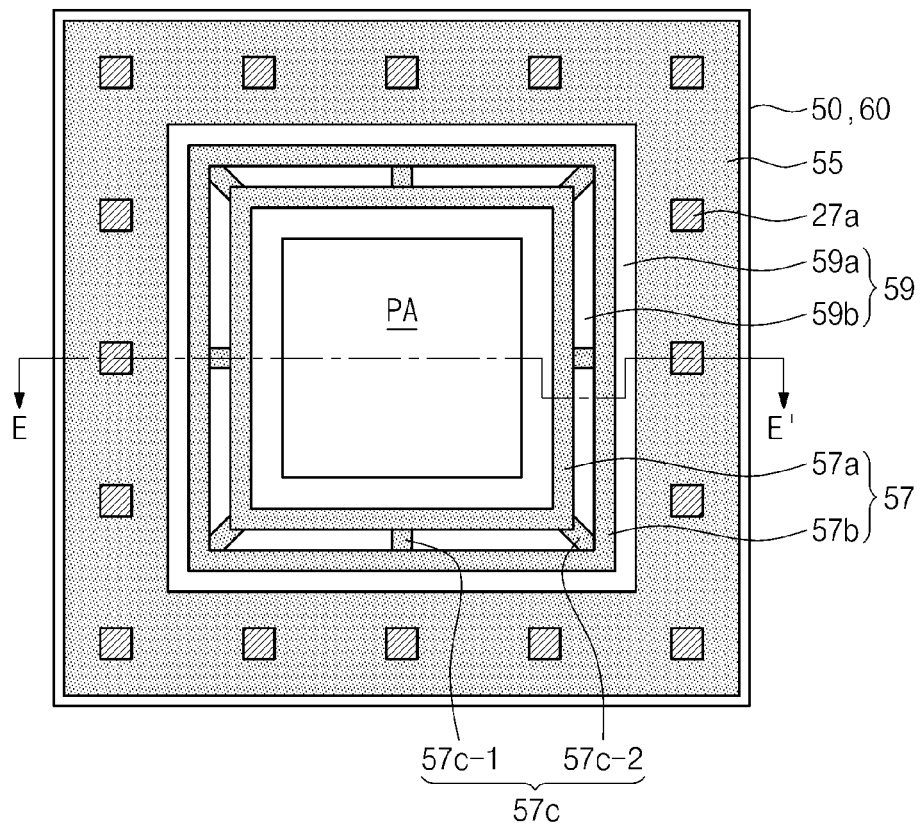
FIG. 10A is a plan view illustrating a semiconductor package according to an embodiment of the present general inventive concept.
Figure 10B:
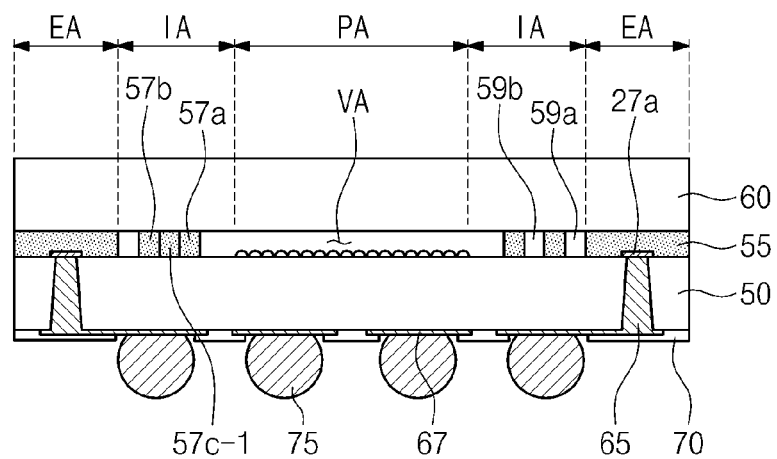
FIG. 10B is a cross-sectional view taken along line E-E' of FIG. 10A.

FIG. 9A is a plan view illustrating a semiconductor package 102 according to an embodiment of the present general inventive concept, and FIG. 9B is a cross-sectional view take along line E-E' of FIG. 9A. FIG. 10A is a plan view illustrating a semiconductor package according to an embodiment of the present general inventive concept, and FIG. 10B is a cross-sectional view taken along line E-E' of FIG. 10A. Since the embodiments of FIGS. 9A-10B are similar to the embodiment of FIGS. 1-4D, detailed descriptions thereof will be omitted. Hereinafter, different features of FIGS. 9A-10B from the embodiment of FIGS. 1-4D will be described.

Referring to FIGS. 9A and 9B, the semiconductor package 102 according to this embodiment includes a dew-proofer 57 that is a dual bar shape. That is, the dew-proofer 57 includes a first dew-proofer 57a having a loop shape surrounding a pixel area PA and a second dew-proofer 57b having a loop shape surrounding the first dew-proofer 57a. The first dew-proofer 57a and the second dew-proofer 57b are spaced from each other. Thus, the second void area 59 are divided into a first sub void area 59a between the second dew-proofer 57b and the adhesive pattern 55 and a second sub void area 59b between the first dew-proofer 57a and the second dew-proofer 57b.

A method for manufacturing the semiconductor package 102 may be identical to that of embodiment 1, except that the dew-proofer 57 is formed to include the first dew-proofer 57a and the second dew-proofer 57b in the process of FIG. 4A.

Referring to FIGS. 10A and 10B, a connecting part 57c can be formed between the first dew-proofer 57a and the second dew-proofer 57b. The connecting part 57c may include one or more first connecting parts 57c-1 and one or more second connecting parts 57c-2. The first connecting parts 57c-1 may be disposed between corners of the first dew-proofer 57a and the second dew-proofer 57b, and the second connecting parts 57c-2 may be disposed at the corners of the first dew-proofer 57a and the second dew-proofer 57b. It is possible that at least one of the first connecting parts 57c-1 and/or second connecting parts 57c-2 can be formed to connect the first dew-proofer 57a and second dew-proofer 57b. The first dew-proofer 57a can be disposed between the adjacent second dew-proofers 57b. Alternatively, the second dew-proofer 57b can be disposed between the adjacent first dew-proofers 57a. It is also possible that the first dew-proofer 57a may not be formed on one side of the first dew-proofer 57a and the second dew-proofer 57b but may be formed on another side of the first dew-proofer 57a and the second dew-proofer 57b. It is also possible that the second dew-proofer 57a may not be formed at one corner of the first dew-proofer 57a and the second dew-proofer 57b but may be formed on another corner of the first dew-proofer 57a and the second dew-proofer 57b. However, the present general inventive concept is not limited thereto. That is, one or more of the first connecting part 57c-1 and the second connecting part 57c-2 can be formed or arranged on a corresponding side or corner of the first dew-proofer 57a and the second dew-proofer 57b according to a user preference and/or a design purpose of the semiconductor package 102B.

Figure 11:
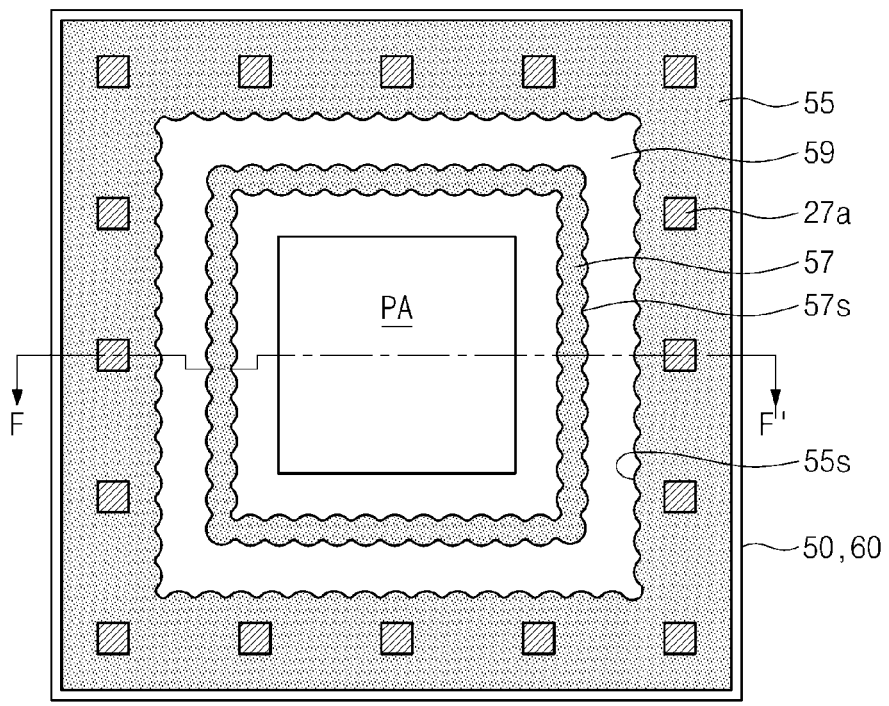
FIG. 11 is a plan view illustrating a semiconductor package according to an embodiment of the present general inventive concept.
Figure 12:
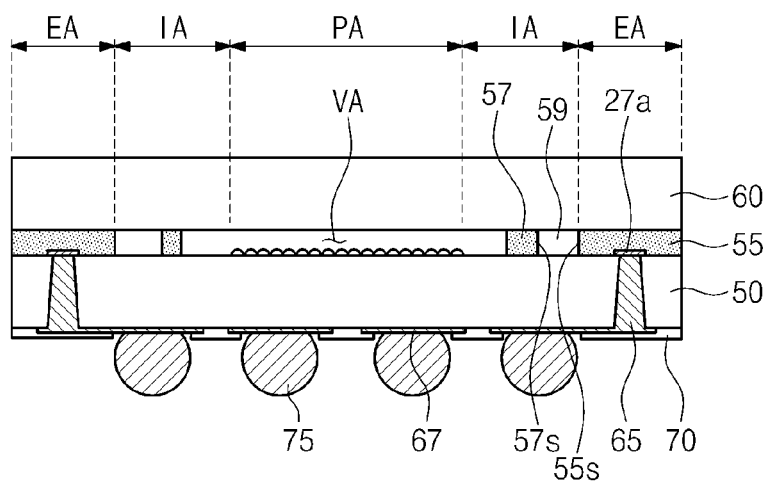
FIG. 12 is a cross-sectional view taken along line F-F' of FIG. 11.

FIG. 11 is a plan view illustrating a semiconductor package according to an embodiment of the present general inventive concept. FIG. 12 is a cross-sectional view taken along line F-F' of FIG. 11. Since the embodiment of FIGS. 11 and 12 is similar to the embodiment of FIGS. 1-4D, detail descriptions thereof are omitted. Hereinafter, different features from the embodiment FIGS. 1-4D will be described.

Referring to FIGS. 11 and 12, a dew-proofer 57 included in a semiconductor package 103 according to this embodiment has a sidewall of a curved profile 57s. Also, an adhesive pattern 55 included in the semiconductor package 103 has a sidewall of a curved profile 55s opposite to the sidewall of the dew-proofer 57. For example, the sidewall of curved profile may be concavo-convex or uneven, or have protrusion overlapped with the solder ball. A crystal face of a silicon crystal constituting a semiconductor substrate may be fragile to physical shocks. This may occur in a singulation process more easily, but may be reduced by the curved profiles 57s and 55s.

A method for manufacturing the semiconductor package 103 may be identical to that of embodiment 1, except that the dew-proofer 57 and the adhesive pattern are formed to have sidewalls of curved profiles 57s and 55s in the process of FIG. 4A.

Figure 13:
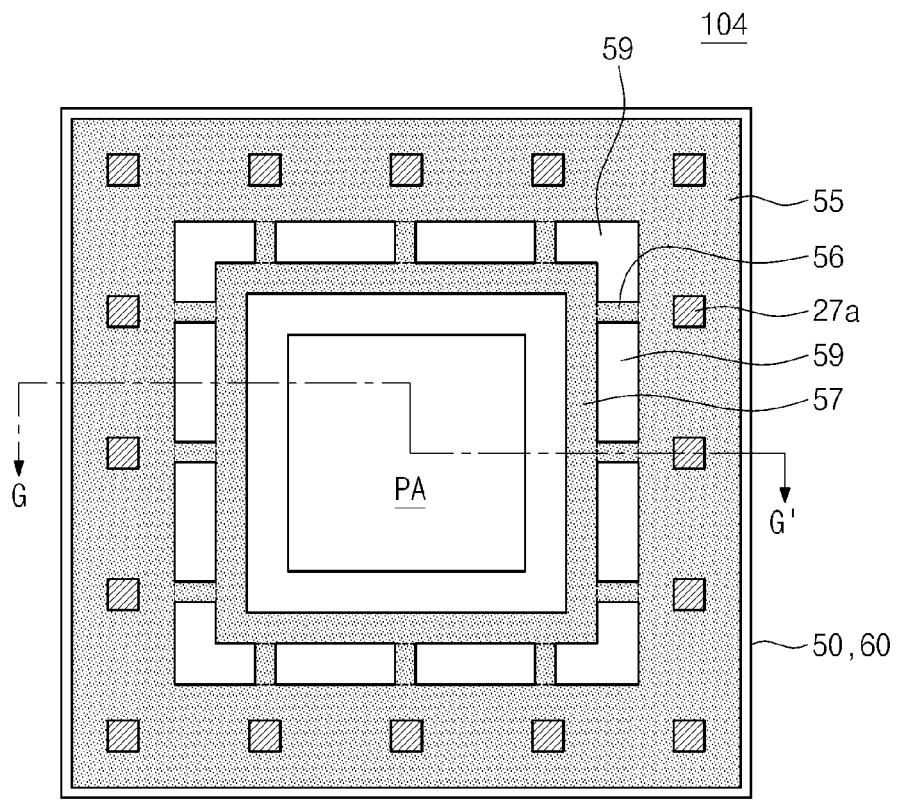
FIG. 13 is a plan view illustrating a semiconductor package according to an embodiment of the present general inventive concept.
Figure 14:
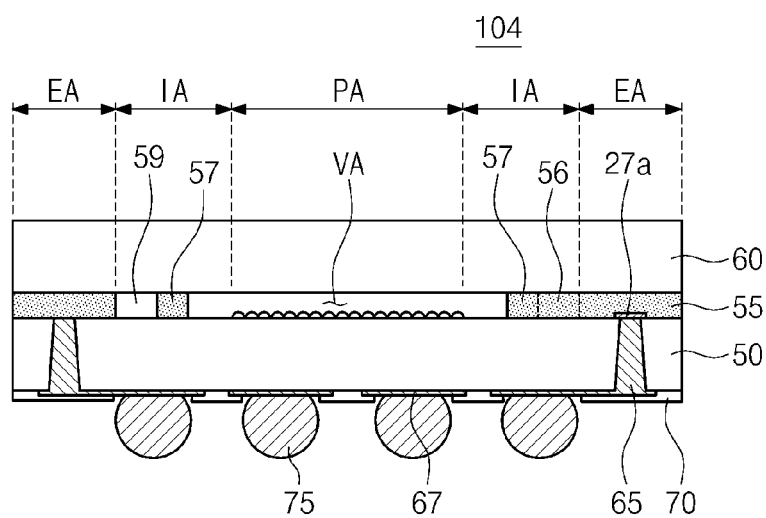
FIG. 14 is a cross-sectional view taken along line G-G' of FIG. 13.

FIG. 13 is a plan view illustrating a semiconductor package 104 according to an embodiment of the present general inventive concept. FIG. 14 is a cross-sectional view taken along line G-G' of FIG. 13. Since the embodiment of FIGS. 13 and 14 is similar to the embodiment of FIGS. 1-4D, detail descriptions thereof are omitted. Hereinafter, different features from the embodiment of FIGS. 1-4D will be described.

Referring to FIGS. 13 and 14, the semiconductor package 104 according to this embodiment may further include a connection part 56 that connects an adhesive pattern 55 and a dew-proofer 57. Thus, the second void area 59 may be defined by the adhesive pattern 55, the dew-proofer 57, and the connection part 56. The connection part 56 may be formed of the same material as the adhesive pattern 55. The connection part 56 connects a portion of the sidewall of the adhesive pattern 55 having a rectangular loop shape to a portion of the sidewall of the dew-proofer 57 having a rectangular loop shape therein. The connection part 56 may prevent the dew-proofer from falling down. Also, adhesive strength between a transparent substrate 50 and a semiconductor chip 50 may be improved by the connection part 56.

A method for manufacturing the semiconductor package 104 may be identical to that of embodiment 1, except that the connection part 56 is formed simultaneously with the dew-proofer 57 and the adhesive pattern 55 in the process of FIG. 4A.

Figure 15:
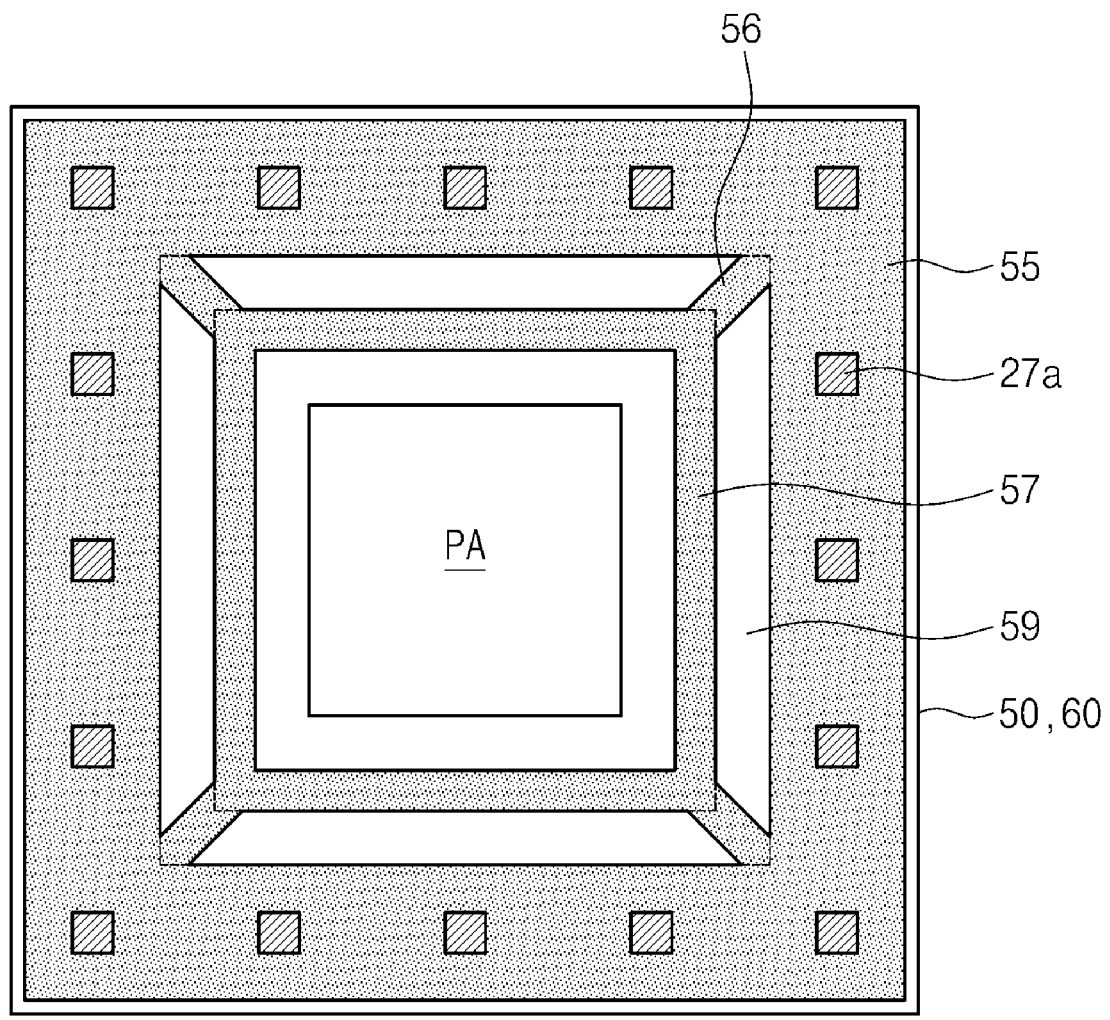
FIG. 15 is a plan view illustrating a semiconductor package according to an embodiment of the present general inventive concept.

FIG. 15 is a plan view illustrating a semiconductor package 105 according to an embodiment of the present general inventive concept. Since the embodiment of FIG. 15 is similar to the embodiment of FIGS. 1-4D, detail descriptions thereof are omitted. Hereinafter, different features from the embodiment of FIGS. 1-4D will be described.

Referring to FIG. 15, the semiconductor package 105 according to this embodiment may further include a connection part 56 that connects an adhesive pattern 55 and a dew-proofer 57. The connection part 56, as described in FIG. 15, connects an inner edge of the adhesive pattern 55 having a rectangular loop shape to an outer edge of the dew-proofer having a rectangular loop shape therein. Thus, a second void area 59 may be defined the adhesive pattern 55, the dew-proofer 57, and the connection part 56, and have a trapezoid shape when viewed from above. The connection part 56 may be formed of the same material as the adhesive pattern 55. The connection part 56 may prevent the dew-proofer 57 from falling down. Also, adhesive strength between a transparent substrate 60 and a semiconductor chip 50 may be improved by the connection part 56.

A method for manufacturing the semiconductor package 105 may be identical to that of embodiment 1, except that the connection part 56 is formed simultaneously with the dew-proofer 57 and the adhesive pattern 55 in the process of FIG. 4A.

Figure 16:
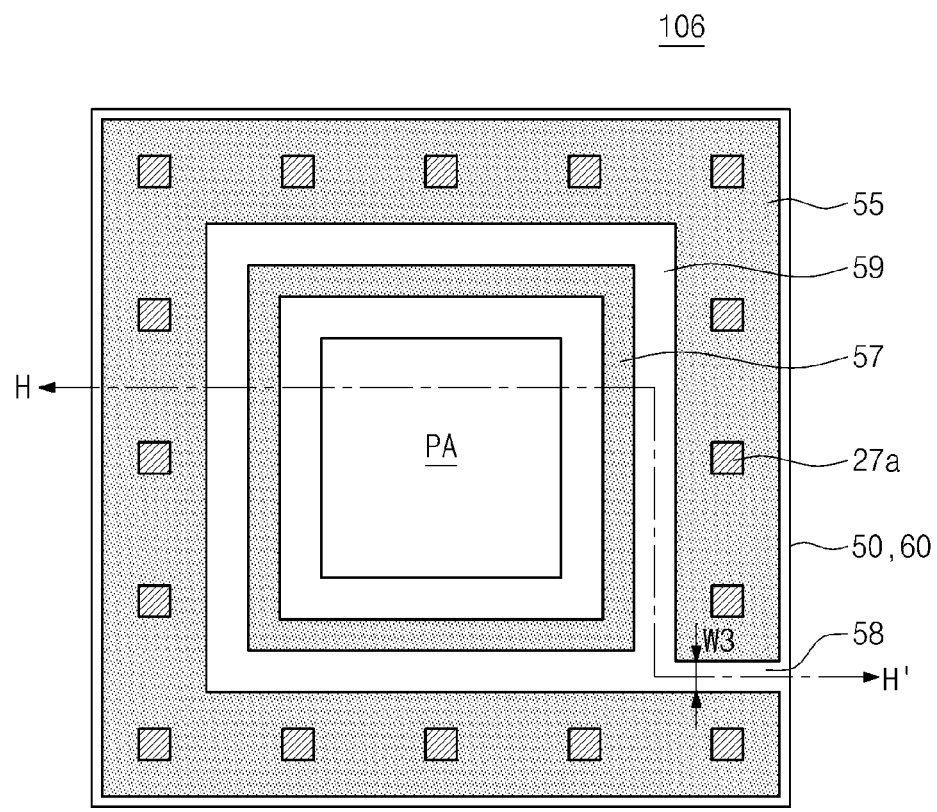
FIG. 16 is a plan view illustrating a semiconductor package according to an embodiment of the present general inventive concept.
Figure 17:
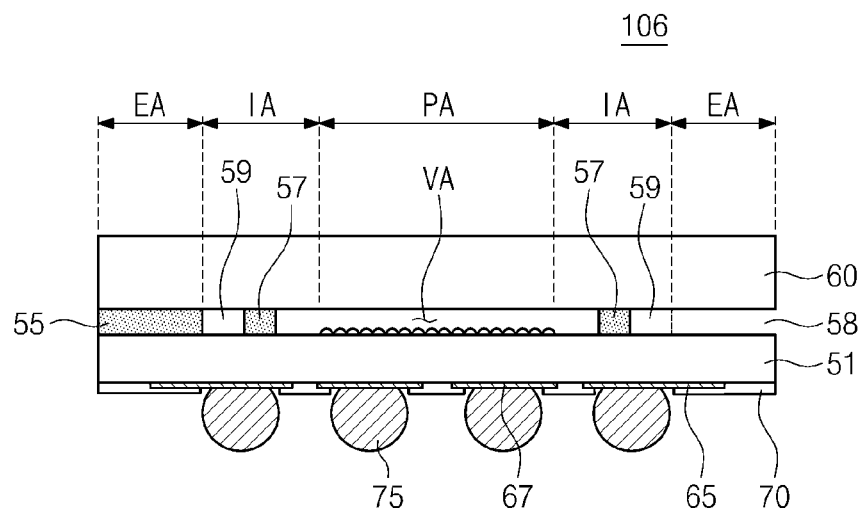
FIG. 17 is a cross-sectional view taken along line H-H' of FIG. 16.

FIG. 16 is a plan view illustrating a semiconductor package 106 according to an embodiment of the present general inventive concept. FIG. 17 is a cross-sectional view taken along line H-H' of FIG. 16. Since the embodiment of FIGS. 16 and 17 is similar to the embodiment of FIGS. 1-4D, detail descriptions thereof are omitted. Hereinafter, different features from the embodiment of FIGS. 1-4D will be described.

Referring to FIGS. 16 and 17, in the semiconductor package 106 according to this embodiment, a ventilating opening 58 is formed in an adhesive pattern 55 to connect between a second void area 59 and the outside. The ventilating opening 58 may have a width W3 of about 200 μm or less. Specifically, the width W3 of the ventilating opening 58 may range from about 0.1 μm to about 200 μm. Thus, humidity exhausted from the adhesive pattern 55 may easily escape to the outside through the ventilating opening 58.

A method of manufacturing the semiconductor package 106 may be identical to that of the embodiment of FIGS. 1-4D, except that the adhesive pattern 55 is formed to include the ventilating opening 58 in the process of FIG. 4A. Alternatively, after the adhesive pattern 55 having a fully loop shape is formed in the process of FIG. 4A of embodiment 1, the ventilating opening 58 may be formed by removing a portion of the adhesive pattern 55 before bonding of the transparent substrate 60 and the semiconductor chip 50.

Figure 18:
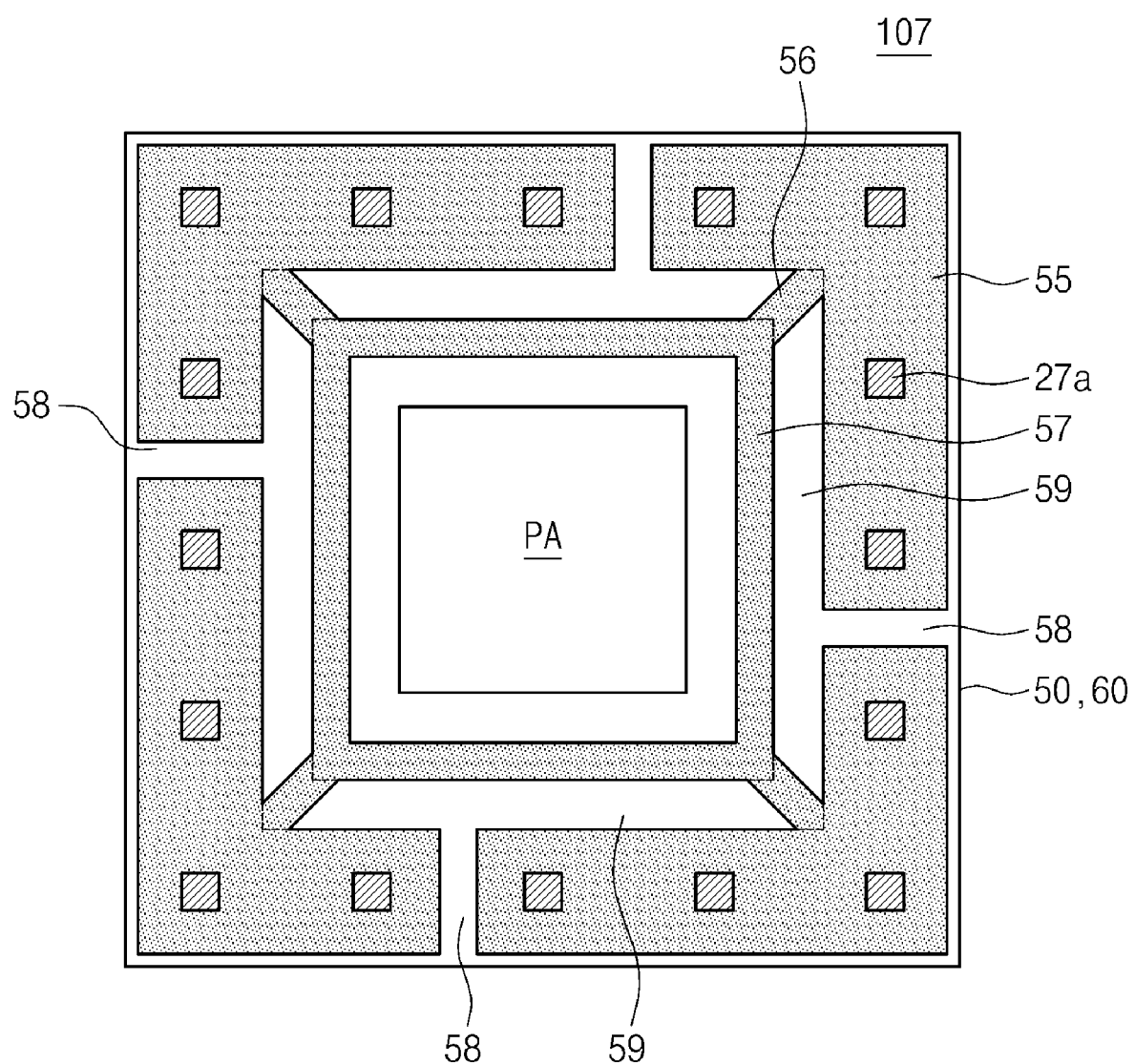
FIG. 18 is a plan view illustrating a semiconductor package according to an embodiment of the present general inventive concept.

FIG. 18 is a plan view illustrating a semiconductor package 107 according to an embodiment of the present general inventive concept. Since the embodiment of FIG. 18 is similar to the embodiment of FIGS. 1-4D, detail descriptions thereof are omitted. Hereinafter, different features from the embodiment of FIGS. 1-4D will be described.

Referring to FIG. 18, the semiconductor package 107 according to this embodiment has a combination shape of the semiconductor packages 105 and 106. That is, connection parts 56 are disposed to connect inner edges of an adhesive pattern 55 having a rectangular loop shape to outer edges of a dew-proofer 57 having a rectangular loop shape, respectively. Thus, four second void areas 59 having a trapezoid shape when viewed from above are defined. The adhesive pattern 55 may include ventilating openings 58 that connect between the second void areas 59 and the outside, respectively. The ventilating openings 58 may have a structure similar to that of the embodiment of FIGS. 16-17.

A method of manufacturing the semiconductor package 107 may be identical to that of the embodiment of FIGS. 1-4D, except that the connection part 56 are formed simultaneously with the adhesive pattern 55 and the dew-proofer 57, and the adhesive pattern 55 is formed to include the ventilating opening 58 in the process of FIG. 4A. Alternatively, in the process of FIG. 4A, after the connection part 56, the adhesive pattern 55, and the dew-proofer 57 are formed as illustrated in the plan view of FIG. 16, the ventilating opening 58 may be formed by removing a portion of the adhesive pattern 55 before bonding of the transparent substrate 60 and the semiconductor chip 50.

Figure 19:
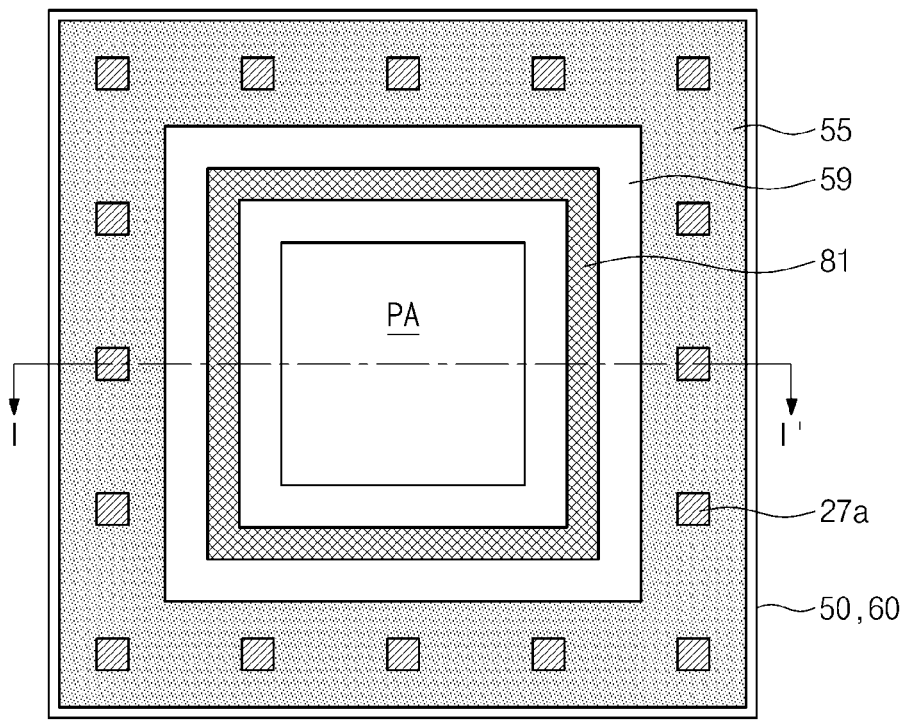
FIG. 19 is a plan view illustrating a semiconductor package according to an embodiment of the present general inventive concept.
Figure 20:
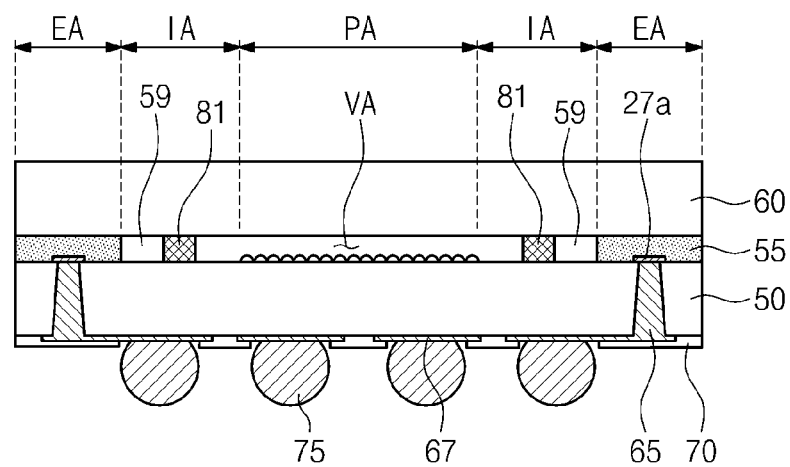
FIG. 20 is a cross-sectional view taken along line I-I' of FIG. 19.

FIG. 19 is a plan view illustrating a semiconductor package 108 according to an embodiment of the present general inventive concept. FIG. 20 is a cross-sectional view taken along line I-I' of FIG. 19. Since the embodiment of FIGS. 19 and 20 is similar to the embodiment of FIGS. 1-4D, detail descriptions thereof are omitted. Hereinafter, different features from the embodiment of FIGS. 1-4D will be described.

Referring to FIGS. 19 and 20, the semiconductor package 108 according to this embodiment includes a dew-proofer 81. The dew-proofer 81 may be formed of different materials from that of an adhesive pattern 55.

As an example, the dew-proofer 81 may be a material that blocks humidity almost completely. In this case, the dew-proofer 81 may be a rubber ring. Since the rubber ring has elasticity, the rubber ring may be interposed between a semiconductor chip 50 and a transparent substrate 60 in an interface area IA to completely seal a first void area VA from the outside. Alternatively, the dew-proofer 81 may be a material such as glass, inert metal, or hardened plastic, which is solid, completely nonporous, and impermeable. Since these materials have no elasticity, a slight gap may be formed between the dew-proofer 81 and the transparent substrate 60 and/or between the dew-proofer 81 and the semiconductor chip 50. For this, an adhesive film may be interposed between the dew-proofer 81 and the transparent substrate 60 and/or between the dew-proofer 81 and the semiconductor chip 50. Here, since the amount of the adhesive film is very slight compared to the amount of the adhesive material included in the dew-proofer 57 of the embodiment of FIGS. 1-4D, the receptive capacity of humidity may be very small. Thus, the condensation phenomenon may be further prevented.

As another example, the dew-proofer 81 may have a function of removing humidity. For example, the dew-proofer 81 may have a moisture absorption function. The dew-proofer 81 may include at least one of highly oxidizing material, ether-based material, silica-containing material, and zeolite. Since the dew-proofer 81 has the function of removing humidity, the condensation phenomenon may be prevented.

Hereinafter a process of forming the semiconductor package 108 will be described—with reference to FIG. 21A through 21D which are cross-sectional views sequentially illustrating operations of forming the semiconductor package of FIG. 20.

Referring to FIG. 21A, a wafer WF is prepared which includes unit semiconductor chips 50 including other parts of FIG. 3 except the through via hole 64, the through via 65, the re-interconnection pad 67, and the insulating film 70. An adhesive pattern 55 is formed on a first surface 50a of the wafer WF in an edge area EA. A photosensitive adhesive polymer film is coated on the first surface 50a of the wafer WF and is processed through a soft baking process at a low temperature of about 50° C. to about 70° C., to form the adhesive pattern 55. Then, an exposure process and a development process are performed to form the adhesive pattern 55.

Figure 21B:
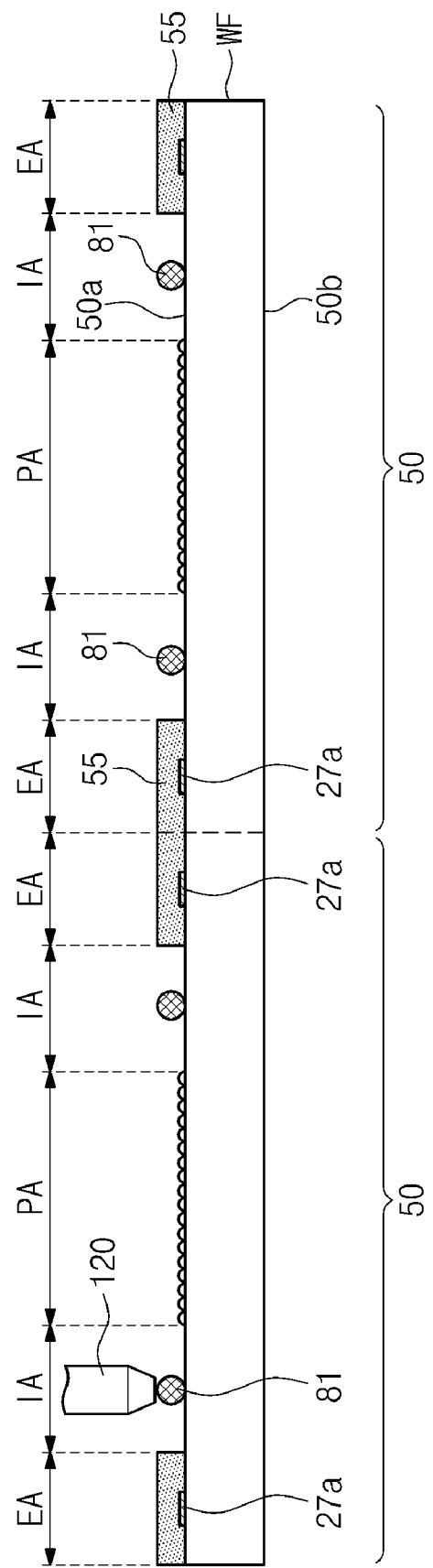

Referring to FIG. 21B, a dew-proofer 81 may be formed using a nozzle 120 in an interface area IA. For example, this may be performed through an ink jetting method.

Figure 21C:
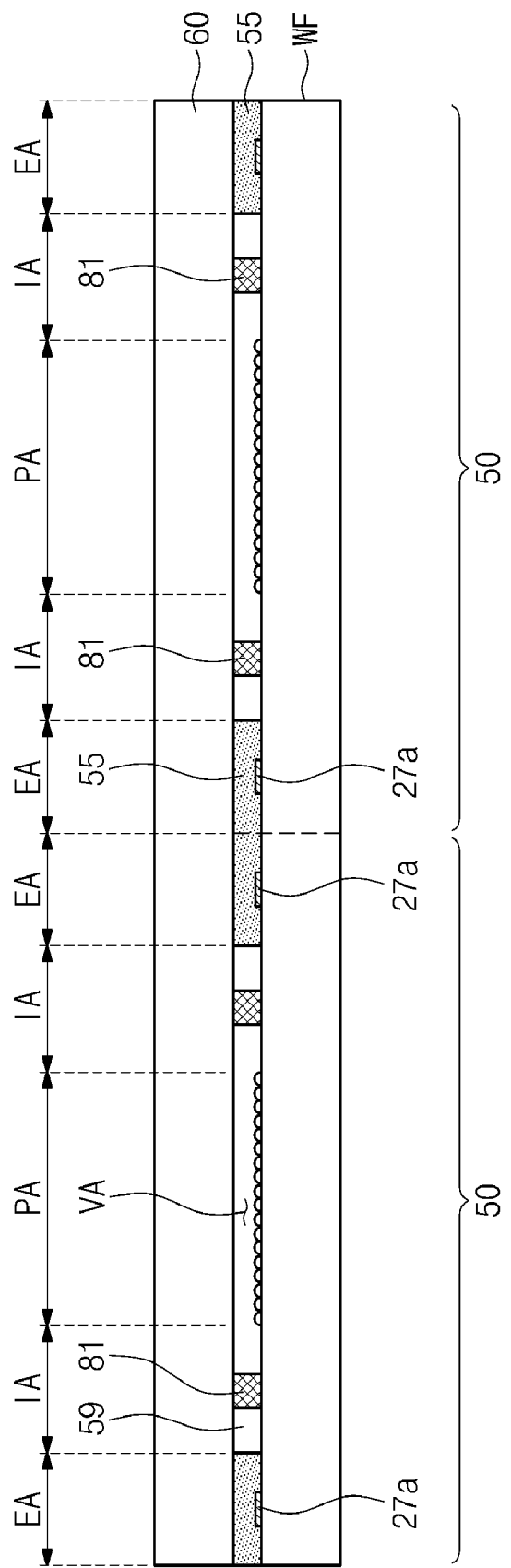

Referring to FIG. 21C, a transparent substrate 60 is disposed over the wafer WF on which the adhesive pattern 55 and the dew-proofer 81 are formed. Then, the transparent substrate 60 is bonded to the wafer WF by pressing and heating (heat treatment). For example, the bonding process may be performed at a temperature ranging from about 150 to about 210. Thus, a first void area VA and a second void area 59 may be defined between the transparent substrate 60 and the wafer WF. Also, moistures in the dew-proofer 81 and the adhesive pattern 55 may be removed through the heat treatment.

Figure 21D:
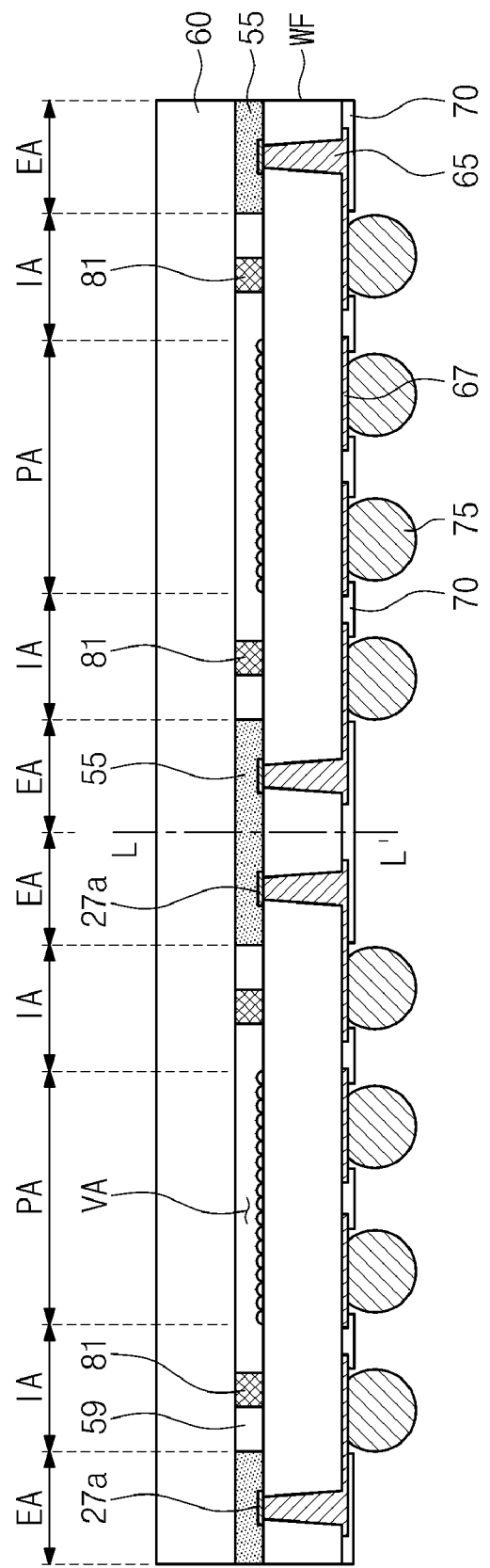

Referring to FIG. 21D, the wafer WF in the edge area EA is partially removed by a laser or the like, forming a through via hole 64 exposing the lower surface of a conductive pad 27a. Then, by stacking and patterning a conductive layer, a through via 65 covering the sidewall of the through via hole 64 and contacting the conductive pad 27a, and a re-interconnection pad 67 disposed on a second surface 50a and electrically connected to the through via 65 are formed. An insulating film 70 is formed to cover a portion of the re-interconnection pad 67 and the through via 65. A solder ball 75 is attached to the re-interconnection pad 67 exposed without being covered with the insulating film 70. Subsequently, a singulation process is performed to cut the transparent substrate 60 and the wafer WF along line L-L' into unit semiconductor chips 50 and separate them into unit semiconductor chips 50. The singulation process may be performed using a diamond cutting blade and the like. Thus, the semiconductor package 108 described in FIGS. 19 and 20 may be formed.

Figure 22:
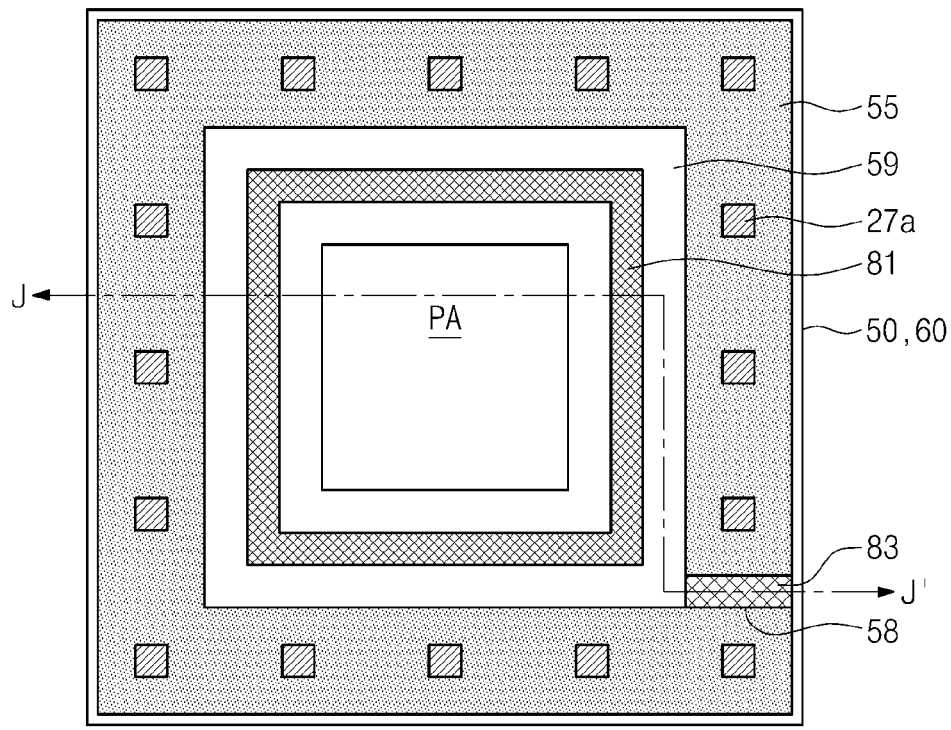
FIG. 22 is a plan view illustrating a semiconductor package according to an embodiment of the present general inventive concept.
Figure 23:
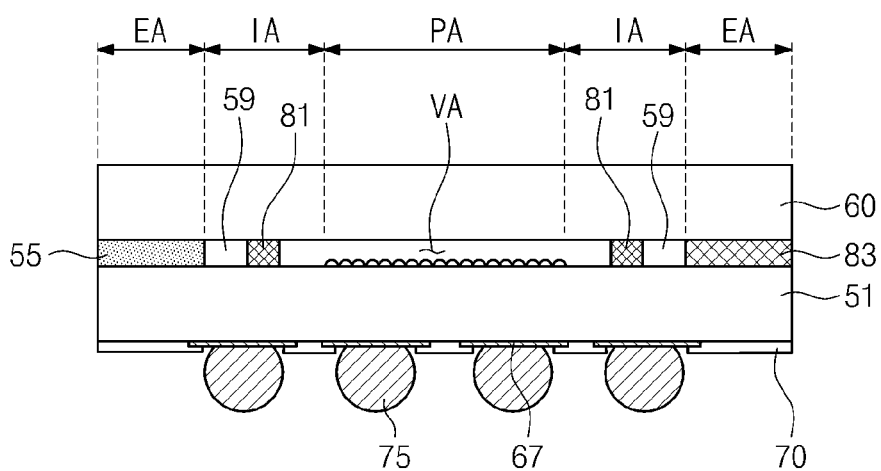
FIG. 23 is a cross-sectional view taken along line J-J' of FIG. 22.

FIG. 22 is a plan view illustrating a semiconductor package 109 according to an embodiment of the present general inventive concept. FIG. 23 is a cross-sectional view taken along line J-J' of FIG. 22. Since the embodiment of FIGS. 22 and 23 is similar to the embodiment of FIGS. 19-21D, detail descriptions thereof are omitted. Hereinafter, different features from the embodiment of FIGS. 19-21D will be described.

Referring to FIGS. 22 and 23, an adhesive pattern 55 included in the semiconductor package 109 according to this embodiment include a ventilating opening 58 in a certain position thereof. The shape of the ventilating opening 58 may be identical to that described in FIG. 7 of embodiment 7. The ventilating opening 58 may be filled with a porous adhesive pattern 83. The porous adhesive pattern may have a lower adhesive strength than the adhesive strength of the adhesive pattern 55. However, the porous adhesive pattern 83 may have more excellent air permeability than the adhesive pattern 55.

According to a method of manufacturing the semiconductor package 109, in the process of FIG. 21A, after the adhesive pattern 55 including the ventilating opening 58 described in the embodiment of FIGS. 16 and 17 is formed, the porous adhesive pattern 83 that is a different material from the adhesive pattern 55 may be disposed in the ventilating opening 58. Other processes may be identical to those in the embodiment of FIGS. 19-21D.

The porous adhesive pattern 83 according to this embodiment may also be disposed in the ventilating opening 58 of FIG. 16.

Figure 24:
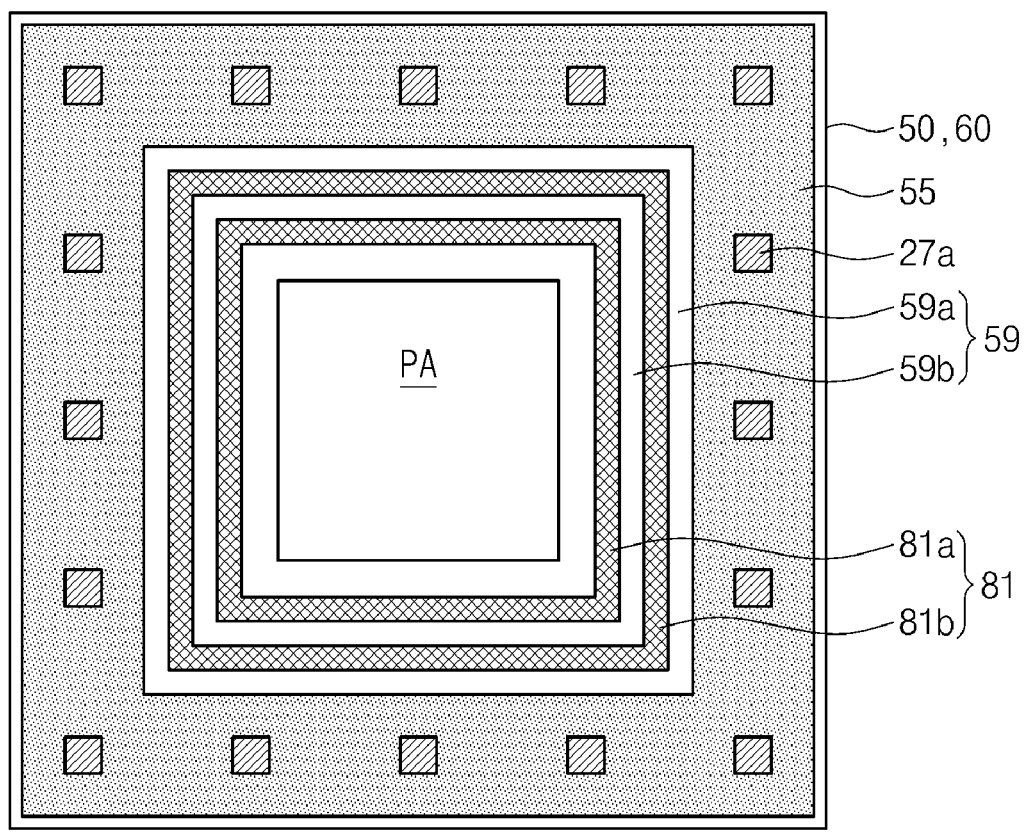
FIG. 24 is a plan view illustrating a semiconductor package according to an embodiment of the present general inventive concept.

FIG. 24 is a plan view illustrating a semiconductor package 110 according to an eleventh embodiment. Since the embodiment of FIG. 24 is similar to the embodiment of FIGS. 19-21D, detail descriptions thereof are omitted. Hereinafter, different features from the embodiment of FIGS. 19-21D will be described.

Referring to FIG. 24, a dew-proofer 81 included in the semiconductor package 110 includes a first dew-proofer 81a having a loop shape surrounding a pixel area PA and a second dew-proofer 81b having a loop shape surrounding the first dew-proofer 81a. The first dew-proofer 81a and the second dew-proofer 81b are spaced from each other. Thus, a first sub void area 59a between an adhesive pattern 55 and the second dew-proofer 81b and a second sub void area 59b between the first dew-proofer 81a and the second dew-proofer 81b may be defined.

A method for manufacturing the semiconductor package 110 may be identical to that of the embodiment of FIGS. 19-21D, except that the dew-proofer 81 is formed in a dual loop shape (the first dew-proofer 81a and the second dew-proofer 81b) in the process of FIG. 21B.

Figure 25:
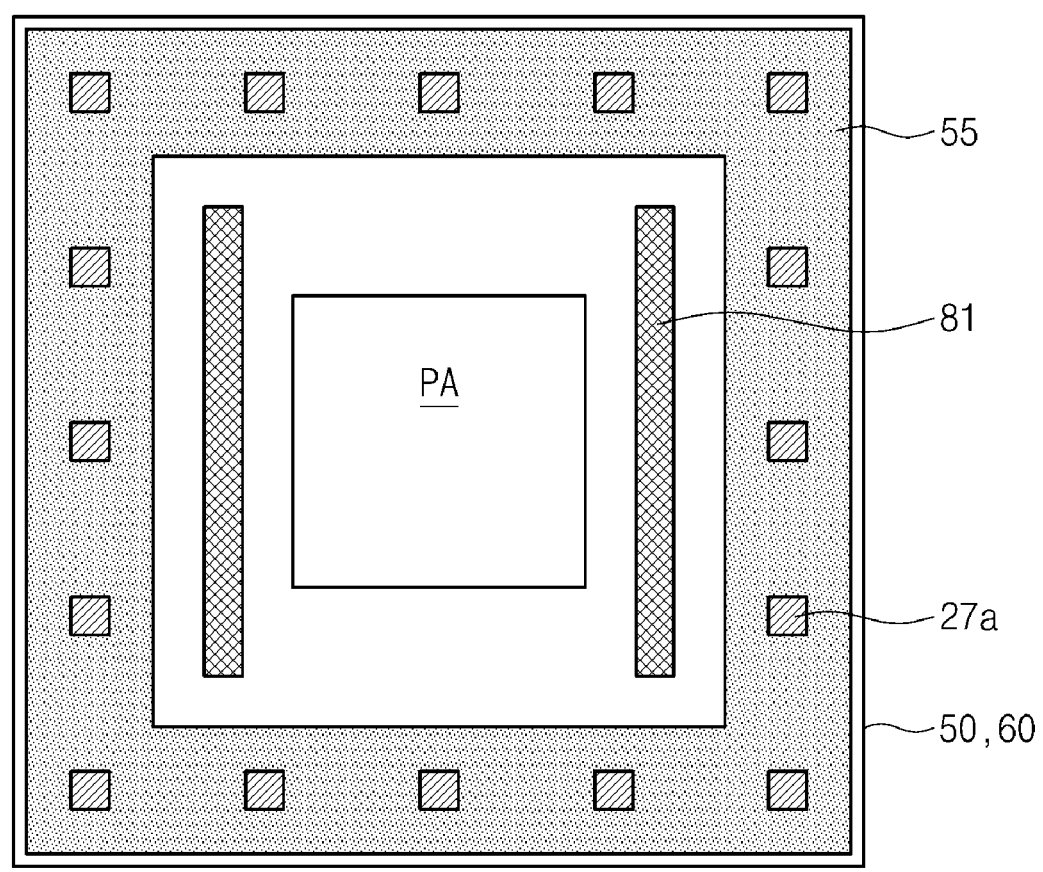
FIG. 25 is a plan view illustrating a semiconductor package according to an embodiment of the present general inventive concept.

FIG. 25 is a plan view illustrating a semiconductor package 111 according to a twelfth embodiment. Since the embodiment of FIG. 25 is similar to the embodiment of FIGS. 19-21D, detail descriptions thereof are omitted. Hereinafter, different features from the embodiment of FIGS. 19-21D will be described.

Referring to FIG. 25, a dew-proofer 81 included in the semiconductor package 111 according to this embodiment may have a bar shape when viewed from above. In this embodiment, since the dew-proofer 81 does not have a loop shape, the second void area 59 as described in embodiment 9 are not defined. This embodiment may be applied to the case where the dew-proofer 81 has a function of removing humidity. For example, the dew-proofer 81 may have a moisture absorption function.

A method for manufacturing the semiconductor package 111 may be identical to that of the embodiment of FIGS. 19-21D, except that the dew-proofer 81 is formed to have a bar shape (when viewed from above) in the process of FIG. 21B.

Figure 26:
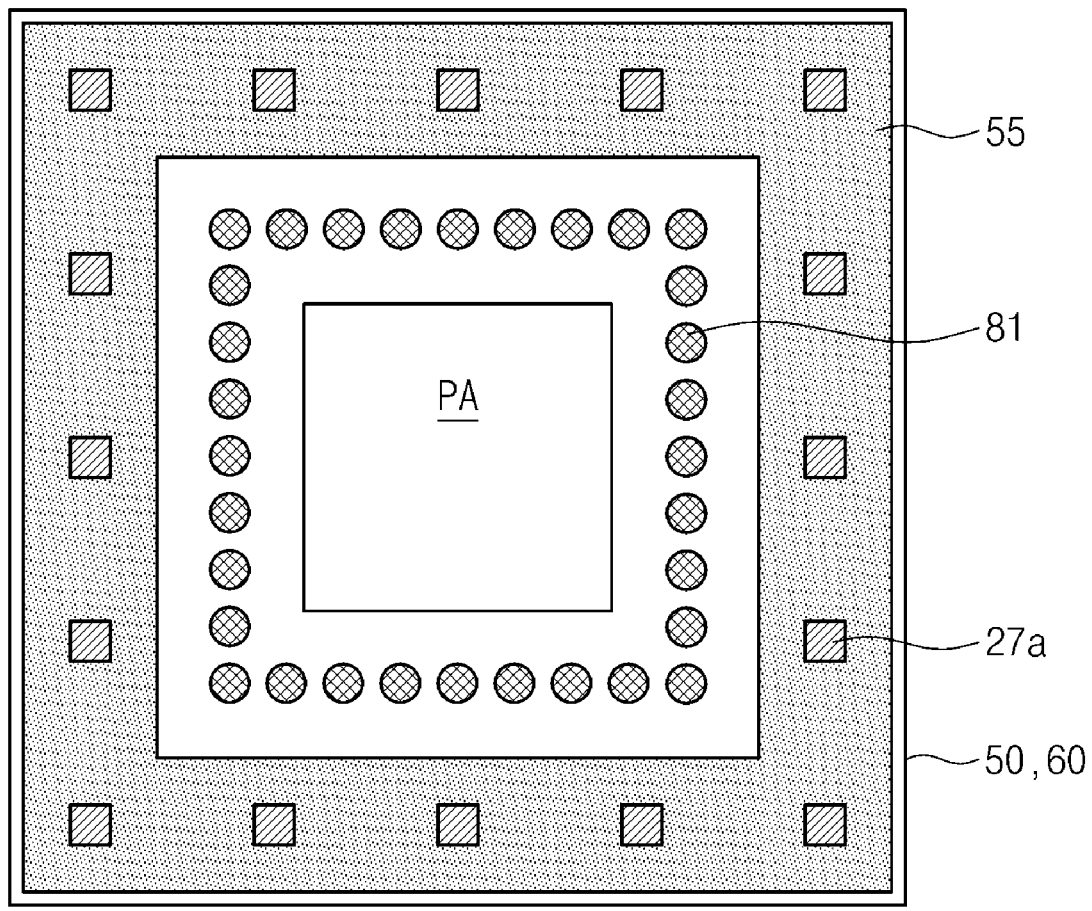
FIG. 26 is a plan view illustrating a semiconductor package according to an embodiment of the present general inventive concept.

FIG. 26 is a plan view illustrating a semiconductor package 112 according to a thirteenth embodiment. Since the embodiment of FIG. 26 is similar to the embodiment of FIGS. 19-21D, detail descriptions thereof are omitted. Hereinafter, different features from the embodiment of FIGS. 19-21D will be described.

Referring to FIG. 26, a dew-proofer 81 included in the semiconductor package 112 according to this embodiment may have a shape of islands isolated from another. This embodiment may be applied to the case wherein the dew-proofer has a function of removing humidity. For example, the dew-proofer 81 may have a moisture absorption function.

A method for manufacturing the semiconductor package 112 may be identical to that of the embodiment of FIGS. 19-21D, except that the dew-proofer 81 is formed to have an island shape in the process of FIG. 21B.

Figure 27A:
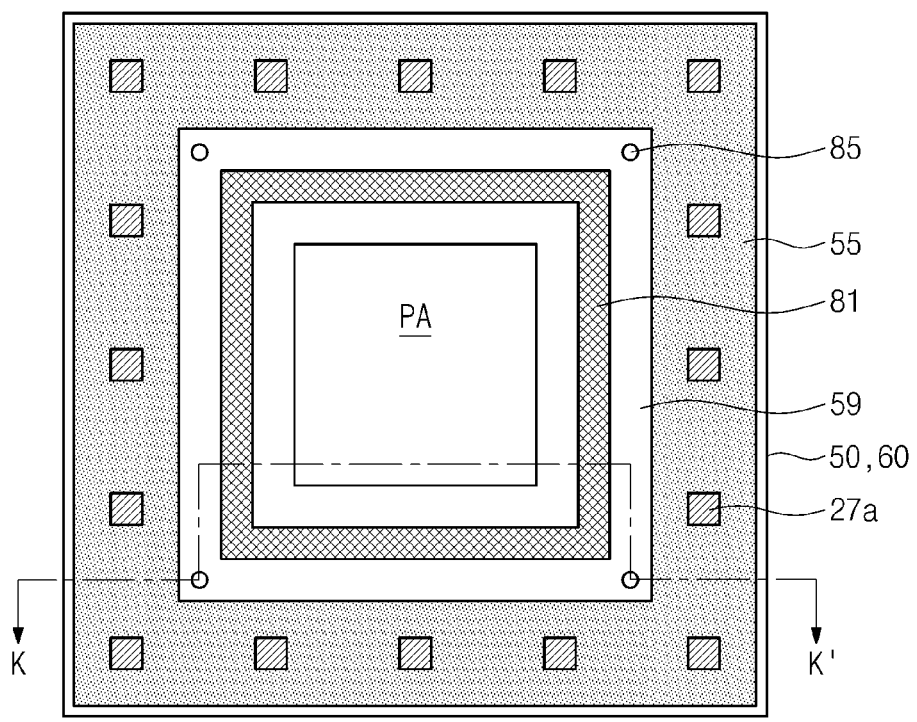
FIG. 27A is a plan view illustrating a semiconductor package according to an embodiment of the present general inventive concept.
Figure 27B:
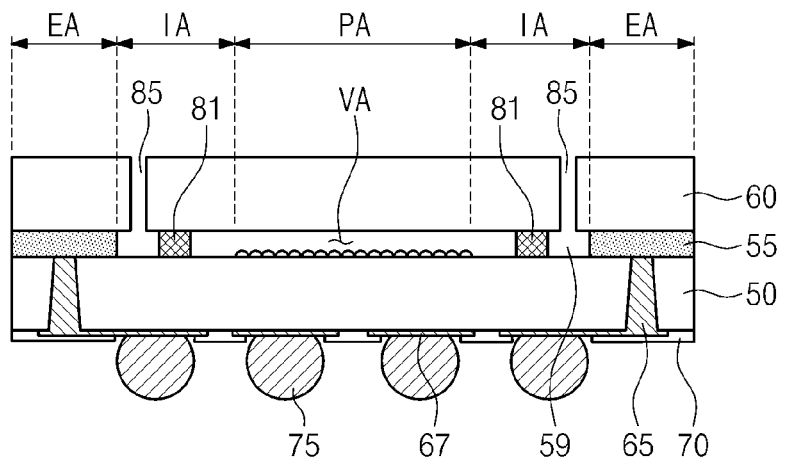
FIG. 27B is a cross-sectional view taken along line K-K' of FIG. 27.

FIG. 27A is a plan view illustrating a semiconductor package 113 according to a fourteenth embodiment. FIG. 27B is a cross-sectional view taken along line K-K' of FIG. 27A. Since the embodiment of FIGS. 27A and 27B is similar to the embodiment of FIGS. 19-21D, detail descriptions thereof are omitted. Hereinafter, different features from the embodiment of FIGS. 19-21D will be described.

Referring to FIGS. 27A and 27B, a through hole 85 connecting a second void area 59 to the outside may be formed in a transparent substrate 60 included in the semiconductor package 113 according to this embodiment. Thus, humidity exhausted from the second void area 59 may escape to the outside through the through hole 85.

A method of manufacturing the semiconductor package 113 may be identical to that of the embodiment of FIGS. 19-21D, except that the through hole 85 is formed in the transparent substrate 60 before the process of FIG. 21C of the embodiment of FIGS. 19-21D.

The through hole 85 according to this embodiment may also be applied to the transparent substrates 60 of embodiments of FIGS. 1-24, for example.

It has been described that the front side-illuminated image sensor chip of the embodiment of FIGS. 1-4D is used as an example of the semiconductor chips 50 of embodiments of FIGS. 1-27B. However, the backside-illuminated image sensor chip 51 of the embodiment of FIGS. 5-7 may also be used in embodiments of FIGS. 1-27B. Moreover, it is possible that a combination of the embodiments of FIGS. 1-27B can be used to form a semiconductor package.

Figure 28A:
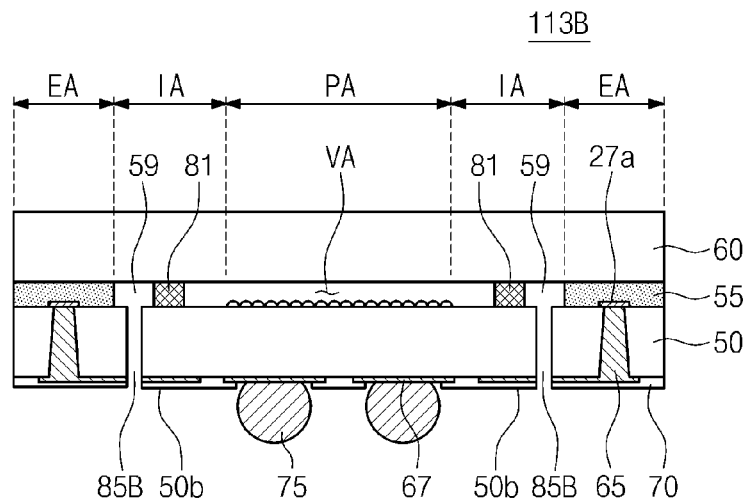
FIG. 28A is a cross-sectional view illustrating a semiconductor package according to an embodiment of the present general inventive concept.
Figure 28B:
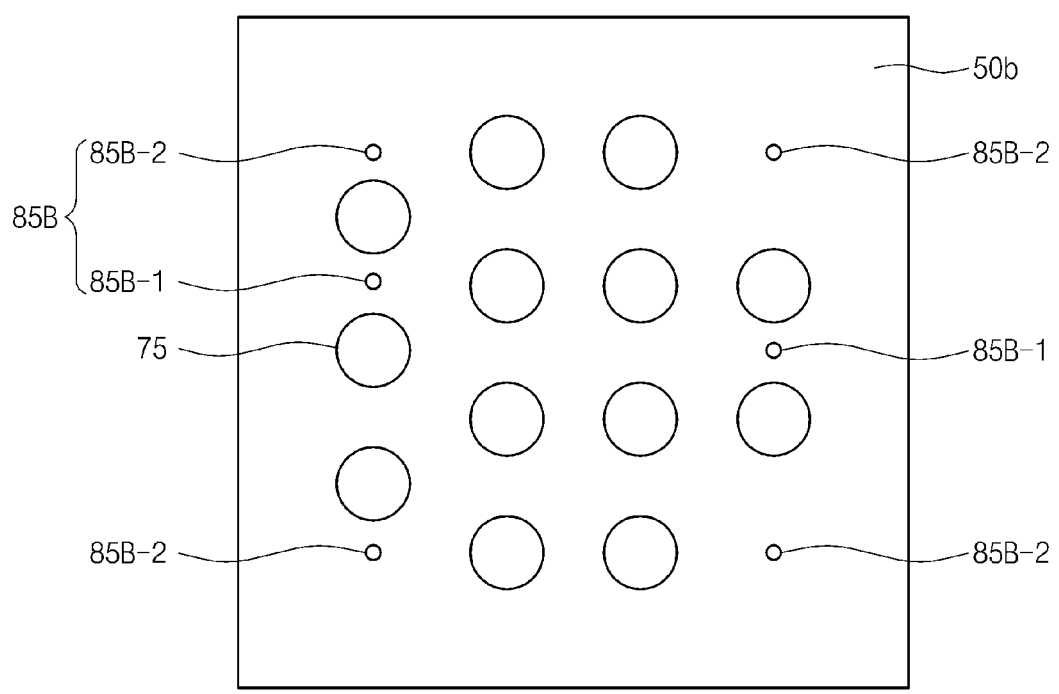
FIG. 28B is a bottom view of the semiconductor package of FIG. 29.

FIG. 28A is a plan view illustrating a semiconductor package according to a fourteenth embodiment. FIG. 28B is a cross-sectional view taken along line K-K' of FIG. 28A. Since the embodiment of FIGS. 28A and 28B is similar to the embodiment of FIGS. 19-21D, detail descriptions thereof are omitted. Hereinafter, only different features from the embodiment of FIGS. 19-21D will be described.

Referring to FIGS. 28A and 28B, a through hole 85B connecting a second void area 59 to an outside of the semiconductor chip 50 may be formed in the semiconductor chip 50 of the semiconductor package 113 according to this embodiment. Thus, humidity contained in the second void area 59 may be discharged into the outside through the through hole 85B.

A method for of manufacturing the semiconductor package 113 may be identical to that of the embodiment 9 of FIGS. 19-21D, except that the through hole 85B is formed in the semiconductor chip 50 in the process of the embodiment of FIGS. 19-21D or in the process of the embodiment of FIGS. 1-4D. The through hole 85B may be formed at a position where the reconnection via 67 or the solder ball 75 is not disposed. It is possible that the through hole may be formed to pass through a portion of the peripheral circuit which transmits the signals from the photoelectric conversion units 5. It is possible that the through hole 85B may be formed at a corner portion of the semiconductor chip 50 as illustrated in FIG. 28B. In this case, the through hole 85B may not be formed to pass through the peripheral circuit of the semiconductor chip 50 and/or the semiconductor package 100.

The through hole 85B according to this embodiment may also be applied to the transparent substrates 60 of embodiments 1 through 11 of FIGS. 1-24, for example.

It has been described that the front side-illuminated image sensor chip of the embodiment 1 of FIGS. 1-4D is used as an example of the semiconductor chips 50 of embodiments 3 through 14 of FIGS. 1-27B. However, the backside-illuminated image sensor chip 51 of the embodiment 2 of FIGS. 5-7 may also be used in embodiments 3 through 14 of FIGS. 1-27B. Moreover, it is possible that a combination of the embodiments 1 to 14 of FIGS. 1-27B can be used to form a semiconductor package.

The embodiment of FIGS. 28A and 28B can be used in the embodiments of FIGS. 1-26. It is possible that a combination of the embodiments of FIGS. 1-28B can be used to form a semiconductor package.

Figure 29:
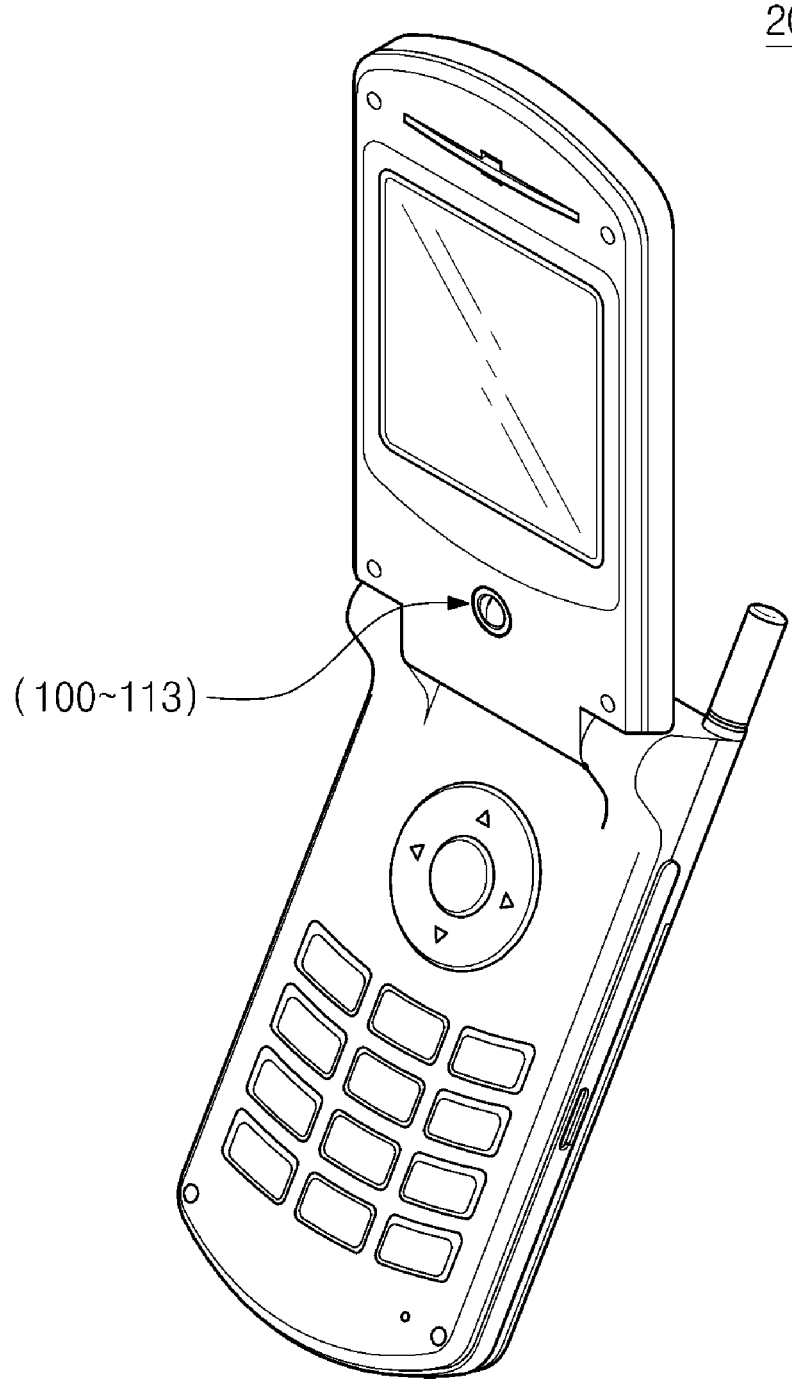
FIG. 29 is a perspective view illustrating an exemplary electronic device including a semiconductor package according to an embodiment of the present general inventive concept.

The semiconductor packages 100 to 113 described above may be provided in an electronic device. As an example, FIG. 29 is a perspective view illustrating an exemplary electronic device including a semiconductor package according to an embodiment. Referring to FIG. 29, the semiconductor packages 100 to 113B described above may be provided in the electronic apparatus, such as a mobile phone 200. In this case, the semiconductor packages 100 to 113 are provided in the mobile phone 200 to be used as a camera (or an image capturing apparatus). Besides, the semiconductor packages 100 to 113 may be provided in electronic devices such as cameras, camcorders, Personal Digital Assistants (PDAs), wireless phones, laptop computers, optical mice, facsimiles, and copying machines. Also, the semiconductor packages 100 to 113 may be apparatuses such as telescopes, mobile phone handsets, scanners, endoscopes, fingerprint identification apparatuses, toys, game machines, household robots, and automobiles.

Figure 30:
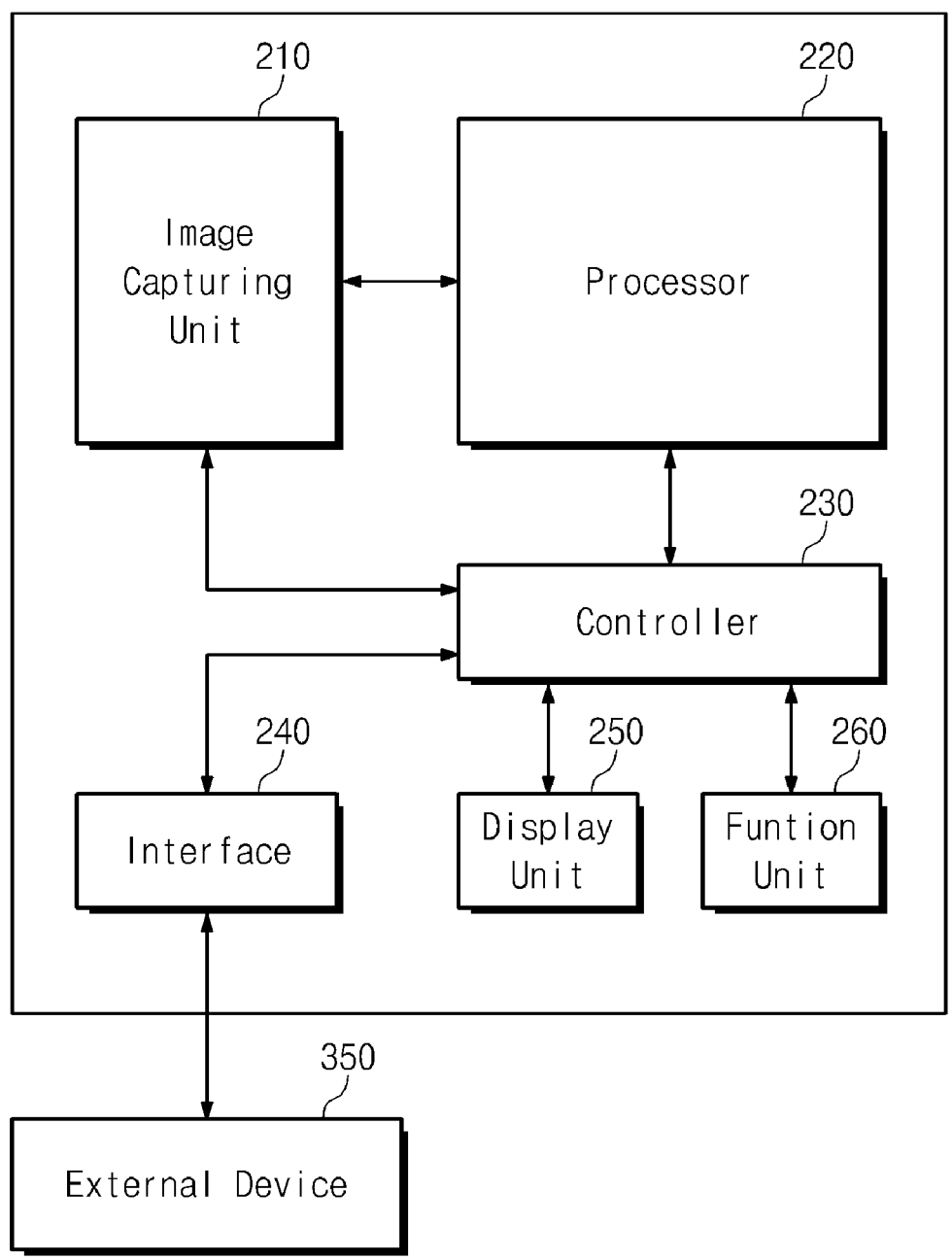
FIG. 30 is a block diagram illustrating an electronic device including a semiconductor package according to an embodiment of the present general inventive concept.

FIG. 30 is a block diagram illustrating an electronic device 300 including a semiconductor package according to an embodiment of the present general inventive concept.

Referring to FIG. 30, the electronic device 300 may be an electronic apparatus using a semiconductor module (or semiconductor package) as descried above in FIGS. 1-28B. The semiconductor module may convert light into an electrical signal and transmit the signal to another component of the electronic apparatus. Cameras, camcorders, Personal Digital Assistants (PDAs), wireless phones, laptop computers, optical mice, facsimiles, and copying machines. Also, the semiconductor packages 100 to 113 may be apparatuses such as telescopes, mobile phone handsets, scanners, endoscopes, fingerprint identification apparatuses, toys, game machines, household robots, and automobiles may be used as the electronic device 300. However, the present general inventive concept is not limited thereto. Other types of an electronic device can be used as the electronic device 300.

The electronic device 300 may include an image capturing unit 210, a processor 220, a controller 230, an interface unit 240, a display unit 250, and a function unit 260. The image capturing unit 210 may include the semiconductor package as described in FIGS. 1-28B. The image capturing unit 210 may output a signal to the processor 220 through the solder ball 75 electrically connected to the processor 220. The controller 230 may be connected to the solder ball 75 to control the image capturing unit 210. The processor may 220 processes the signal of the image capturing unit 210 and generates another signal to be used to display an image in the display unit 250, to form an image on a medium in the function unit 260, or to be transmitted to an external device 350 through the interface unit 240 and a wired or wireless communication line, for example. The controller 230 controls components of the electronic device 300 and may include the processor 220. The function unit 260 may be an input unit to input a command to control a function of the electronic device 300, or a unit to form an image on a medium. However, the present general inventive concept is not limited thereto. The function unit 260 may be a unit to perform a function of the electronic device 300.

Figure 31A:
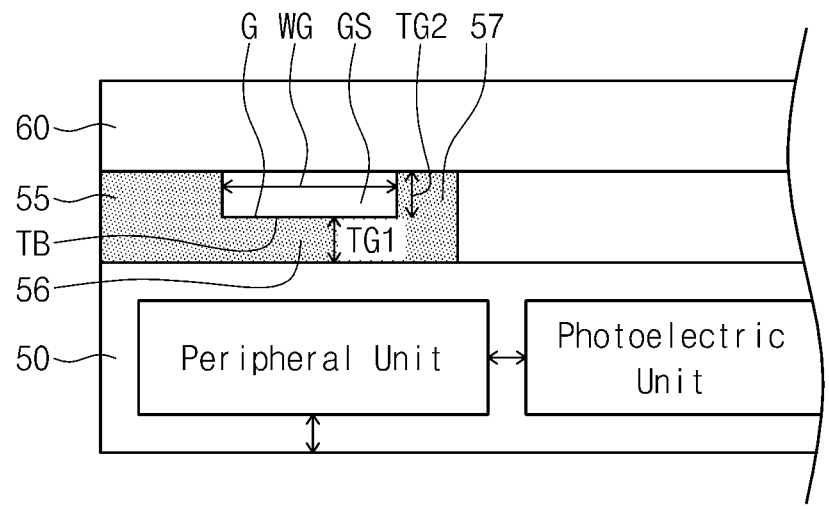
FIGS. 31A and 31B are a view illustrating a space between a plurality of spacers formed in a semiconductor device according to an embodiment of the present general inventive concept.
Figure 31B:
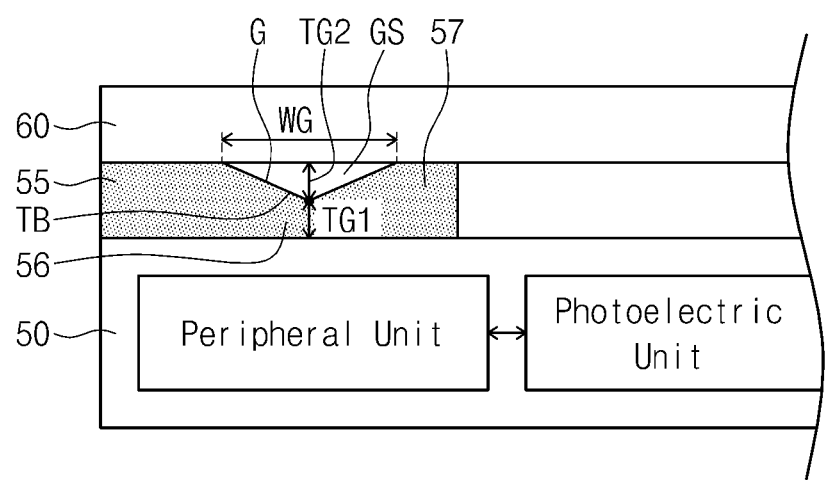

FIGS. 31A and 31B are a view illustrating a space GS between a plurality of spacers formed in a semiconductor device according to an embodiment of the present general inventive concept. This embodiment of FIGS. 31A and 31B will be explained in conjunction with the embodiment of FIGS. 1-4D, for example. However, the present general inventive concept is not limited thereto. It is possible that the embodiment of FIGS. 31A and 31B can be combined with the other embodiment of FIGS. 5-29. The spacers may correspond to the adhesive pattern 55 and the dew proofer 57, for example, to form a space GS. It is possible that a groove G can be formed in a connecting part 56 between the adhesive pattern 55 and the dew proofer 57. The groove G may have a surface to define the space GS to accommodate a particle or condensation which is formed, contained, introduced, or transmitted therein. The groove G may define the Space GS enough to accommodate the particle or condensation to prevent the particle or condensation from being directly transmitted to the pixel area PA, from damaging the photoelectric unit, for example, the micro lens 39, or from interfering with a light transmission from the transparent substrate 60 to the micro lens 39. The groove G of the connecting part 56 may be disposed at a position to correspond to the peripheral unit to transmit a signal of the photoelectric unit to an external device through reconnection via 67 and the solder ball 75, for example.

The groove G may have a bottom TB having a thickness TG1 with respect to the first surface 50a of the semiconductor substrate 50 and a portion having a thickness TG2 with respect to the bottom TB. The portion having the thickness TG2 may be spaced apart by a width WG. The width WG may be longer than the width W2 of the dew proofer 57, and the thickness TG2 may be thinner than a thickness of the drew proofer 57 with respect to the semiconductor substrate 50. A volume of the space GS may be greater than a volume of the dew proofer 57. However, the present general inventive concept is not limited thereto. The width WG, the thicknesses TG1 and TG2, the space GS may vary according to a design of the semiconductor package or a user preference.

It is possible that the connecting part 56 may be included in one of the adhesive pattern 55 and the dew proofer 57. It is also possible that the adhesive pattern 55, the connecting part 56, and the dew proofer 57 can be formed in a single monolithic body. It is also possible that adhesive pattern 55, the connecting part 56, and the dew proofer 57 can be simultaneously formed using the same method or separately formed using one of a same method and different methods.

Accordingly, the space GS may have a shape of the second void area 59, for example, or a rectangular shape, a triangular shape, etc. The connecting part 56 may be additionally formed in the corresponding embodiment of FIGS. 1-28B. The connecting part 56 of FIGS. 31A and 31B may be used as the connecting part 56 of FIGS. 10A, 13, and 18, for example.

Semiconductor packages according to embodiments can prevent dew from being formed on a surface of a transparent substrate or a micro-lens array in a pixel area, by including a dew-proofer.

As described above, a terminology of dew may be a particle introduced into, generated from, or formed in an area of the semiconductor package. The particle may be a water condensation, moisture, vapor or a material (substance) which can affect a structure of the semiconductor package or a function of a micro lens, a peripheral circuit, or a component of the semiconductor package.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A semiconductor package comprising:
a semiconductor chip comprising a pixel area;
a transparent substrate disposed over the semiconductor chip;
an adhesive pattern disposed between the semiconductor chip and the transparent substrate;
a dew-proofer disposed between the semiconductor chip and the transparent substrate,
a first surface facing the transparent substrate;
a second surface opposite to the first surface; and
an external connection unit formed at the second surface, wherein the external connection unit is formed to overlap with at least one of the dew-proofer and the adhesive pattern formed at the first surface.

2. The semiconductor package of claim 1, wherein the dew-proofer has a lower moisture capacity than that of the adhesive pattern.

3. The semiconductor package of claim 1, wherein the dew-proofer comprises the same material as the adhesive pattern, and has a narrower width than that of the adhesive pattern.

4. The semiconductor package of claim 1, wherein the adhesive pattern has a shape of a closed loop arranged along the edge of the semiconductor chip and surrounding the pixel area to seal the space between the semiconductor and the transparent substrate from the outside.

5. The semiconductor package of claim 1, wherein the adhesive pattern is disposed in an edge area of the semiconductor chip, and the dew-proofer is disposed between the pixel area and the adhesive pattern and apart from the pixel area.

6. The semiconductor package of claim 5, wherein the dew-proofer has a shape of a closed loop surrounding the pixel area to define a first space inside of the dew-proofer and a second space between the dew-proofer and the adhesive pattern, the first space being sealed from the outside by the dew-proofer.

7. The semiconductor package of claim 6, wherein the adhesive pattern has a ventilating opening formed to connect the second space to the outside.

8. The semiconductor package of claim 6, further comprising a connection part that connects the adhesive pattern to the dew-proofer.

9. The semiconductor package of claim 1, wherein the dew-proofer has a sidewall with a curved surface.

10. The semiconductor package of claim 1, wherein the adhesive pattern has a side wall with a curved surface.

11. The semiconductor package of claim 1, wherein the semiconductor chip comprises:
a first surface opposite to the transparent substrate;
a second surface on an opposite side of the first surface;
a microlens in the pixel area of the first surface;
a conductive pad in an edge area of the first surface; and
a through via penetrating an inside between the second surface and the first surface and connected to the conductive pad.

12. A semiconductor package comprising:
a semiconductor substrate comprising a pixel area;
a transparent substrate disposed over the semiconductor substrate;
first and second spacers disposed between the semiconductor substrate and the transparent substrate to surround the pixel area and to provide a space between the semiconductor substrate and the transparent substrate;
a first surface facing the transparent substrate;
a second surface opposite to the first surface; and
an external connection unit formed at the second surface, wherein the external connection unit overlaps with at least one of the first and second spacers.

13. The semiconductor package of claim 12, wherein the first spacer has a width different from that of the second spacer with respect to a direction in which the pixel area and the spacers are arranged.

14. The semiconductor package of claim 12, wherein the first spacer is adjacent to but apart from the pixel area, and the second spacer is adjacent to an edge of the semiconductor substrate and apart from the first spacer.

15. The semiconductor package of claim 14, wherein the first spacer functions as a dew proofer and the second spacer functions as an adhesive pattern.

16. The semiconductor package of claim 15, wherein the first spacer comprises a plurality of sub spacers which are spaced apart from each other.

17. The semiconductor package of claim 15, further comprising a third spacer connecting the first spacer and the second spacer.

18. The semiconductor package of claim 17, wherein the third spacer has a height equal to or lower than those of the first spacer and the second spacer.

19. The semiconductor package of claim 14, wherein at least one of the first and second spacers has a sidewall with a curved surface.

20. The semiconductor package of claim 14, wherein the first spacer seals the space over the pixel area from an outside and the second spacer has a ventilating opening.

21. The semiconductor package of claim 14, wherein the first spacer has a lower moisture capacity than that of the second spacer.

* * * * *